United States Patent
Amitai et al.

(10) Patent No.: US 10,782,850 B2
(45) Date of Patent: Sep. 22, 2020

(54) USER INTERFACE AND A METHOD FOR SEARCHING A MODEL

(71) Applicant: Yowza LTD., Tel Aviv (IL)

(72) Inventors: Mor Amitai, Tel Aviv (IL); Naomi Keren, Givat Shmuel (IL); Eyal Fink, Ramat Gan (IL); Amit Aviv, Haifa (IL); Shai Ghelberg, Jerusalem (IL); Shir Peled, Pardes-Hanna Karkur (IL)

(73) Assignee: Yowza LTD., Tel Aviv (IL)

( * ) Notice: Subject to any disclaimer, the term of this patent is extended or adjusted under 35 U.S.C. 154(b) by 518 days.

(21) Appl. No.: 14/883,817

(22) Filed: Oct. 15, 2015

(65) Prior Publication Data
US 2016/0140189 A1 May 19, 2016

Related U.S. Application Data

(63) Continuation-in-part of application No. 14/542,604, filed on Nov. 16, 2014, now abandoned.

(51) Int. Cl.
| | | |
|---|---|---|
| G06F 16/00 | (2019.01) | |
| G06F 3/0482 | (2013.01) | |
| G06F 17/50 | (2006.01) | |
| G06F 16/242 | (2019.01) | |

(52) U.S. Cl.
CPC ............ G06F 3/0482 (2013.01); G06F 17/50 (2013.01); *G06F 16/2425* (2019.01)

(58) Field of Classification Search
None
See application file for complete search history.

(56) References Cited

U.S. PATENT DOCUMENTS

| | | | | |
|---|---|---|---|---|
| 6,657,642 | B1* | 12/2003 | Bardon | G06F 3/0481 |
| | | | | 715/762 |
| 2004/0264777 | A1* | 12/2004 | Furuhashi | G06F 16/5854 |
| | | | | 382/190 |
| 2007/0050412 | A1* | 3/2007 | Robertson | G06F 17/30256 |
| 2007/0242083 | A1* | 10/2007 | Kataoka | G06K 9/00214 |
| | | | | 345/623 |
| 2010/0107077 | A1* | 4/2010 | Hanawa | G06Q 10/06393 |
| | | | | 715/716 |
| 2010/0198563 | A1* | 8/2010 | Plewe | G06F 17/5004 |
| | | | | 703/1 |
| 2011/0196864 | A1* | 8/2011 | Mason | G06F 3/0416 |
| | | | | 707/728 |
| 2014/0074811 | A1* | 3/2014 | Wang | G06F 16/951 |
| | | | | 707/706 |
| 2014/0164362 | A1* | 6/2014 | Syed | G06F 17/30994 |
| | | | | 707/722 |
| 2014/0195963 | A1* | 7/2014 | Cheung | G06F 17/50 |
| | | | | 715/781 |
| 2014/0280039 | A1* | 9/2014 | Bach | G01C 21/3611 |
| | | | | 707/722 |
| 2016/0034150 | A1* | 2/2016 | Behr | G06F 3/04845 |
| | | | | 715/771 |

* cited by examiner

*Primary Examiner* — Son T Hoang
(74) *Attorney, Agent, or Firm* — Reches Patents

(57) ABSTRACT

A method that may include receiving or generating a first search result that comprises a first set of representations of three dimensional objects; wherein multiple representations of the first set are virtually segmented to parts; receiving a search query that identifies a given part of one of the representations of the set; and generating, in response to the given part, a second search result.

19 Claims, 34 Drawing Sheets
(27 of 34 Drawing Sheet(s) Filed in Color)

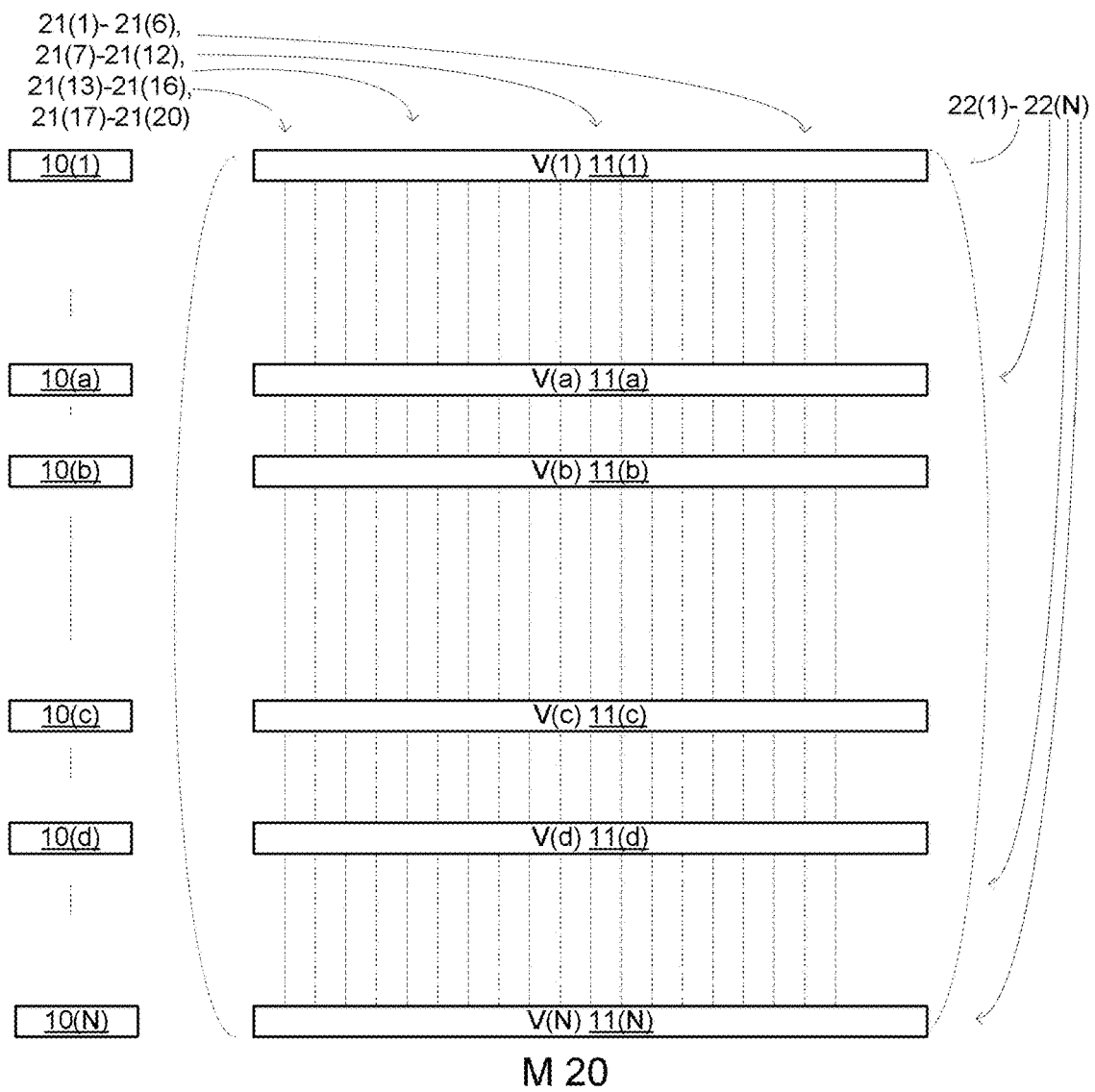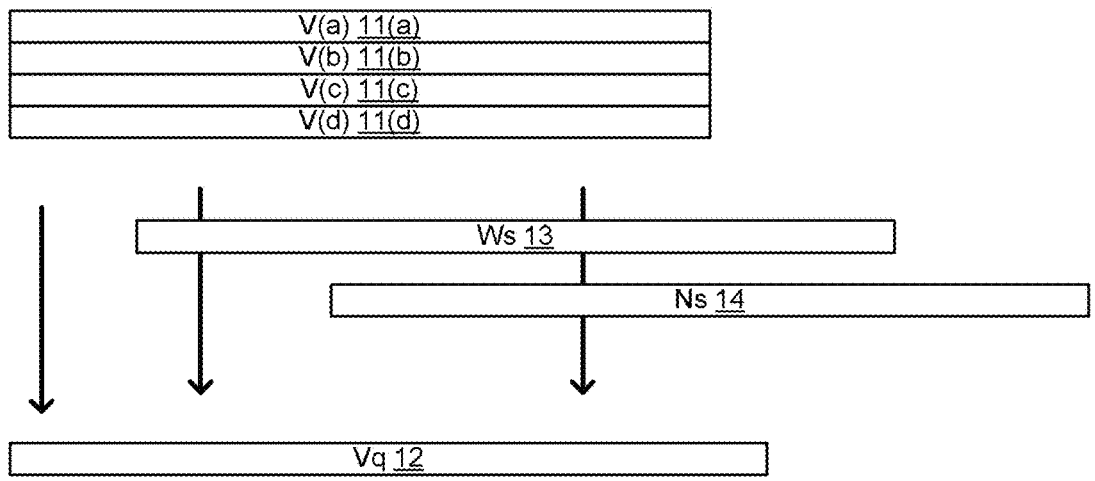
FIG.2

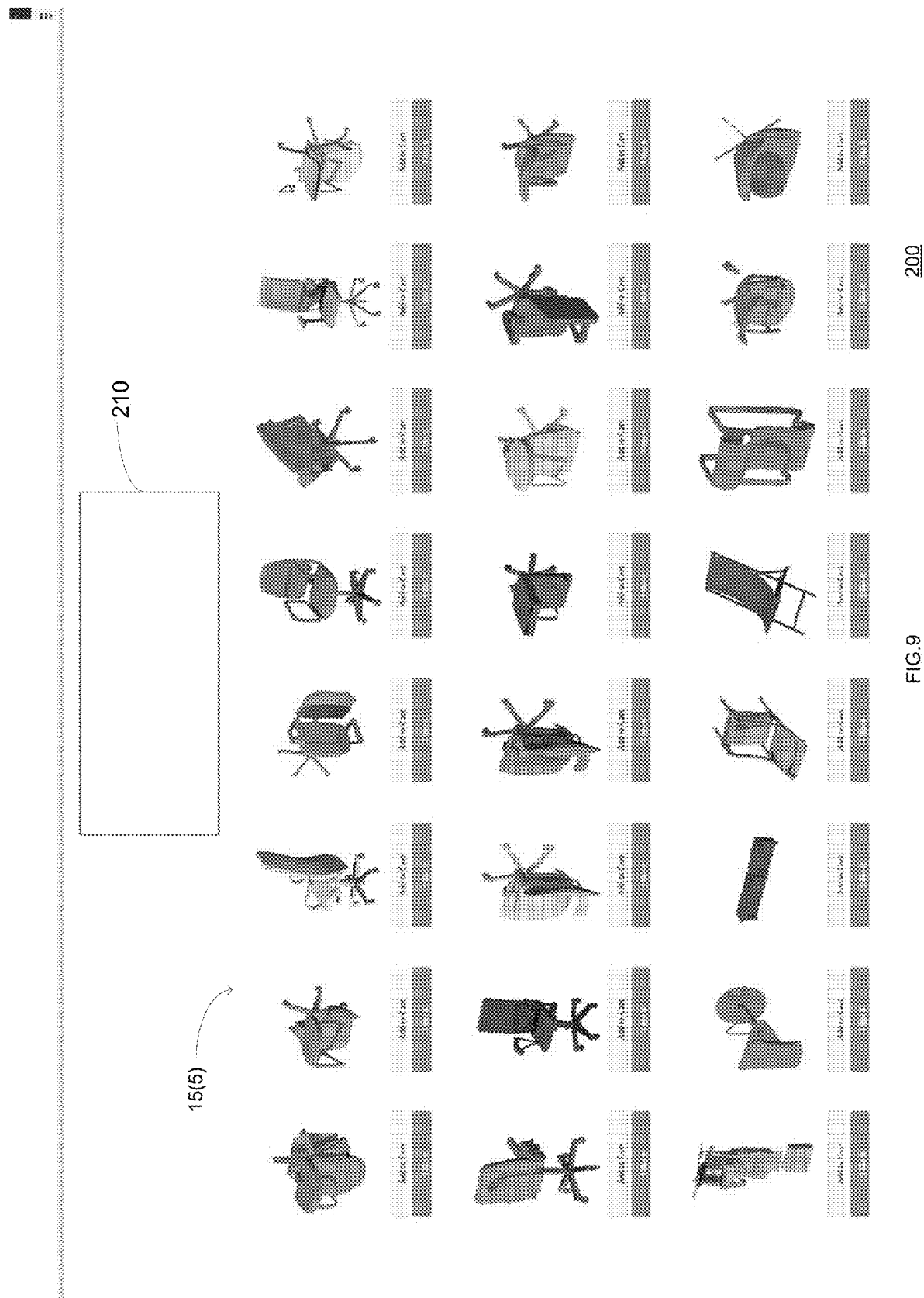

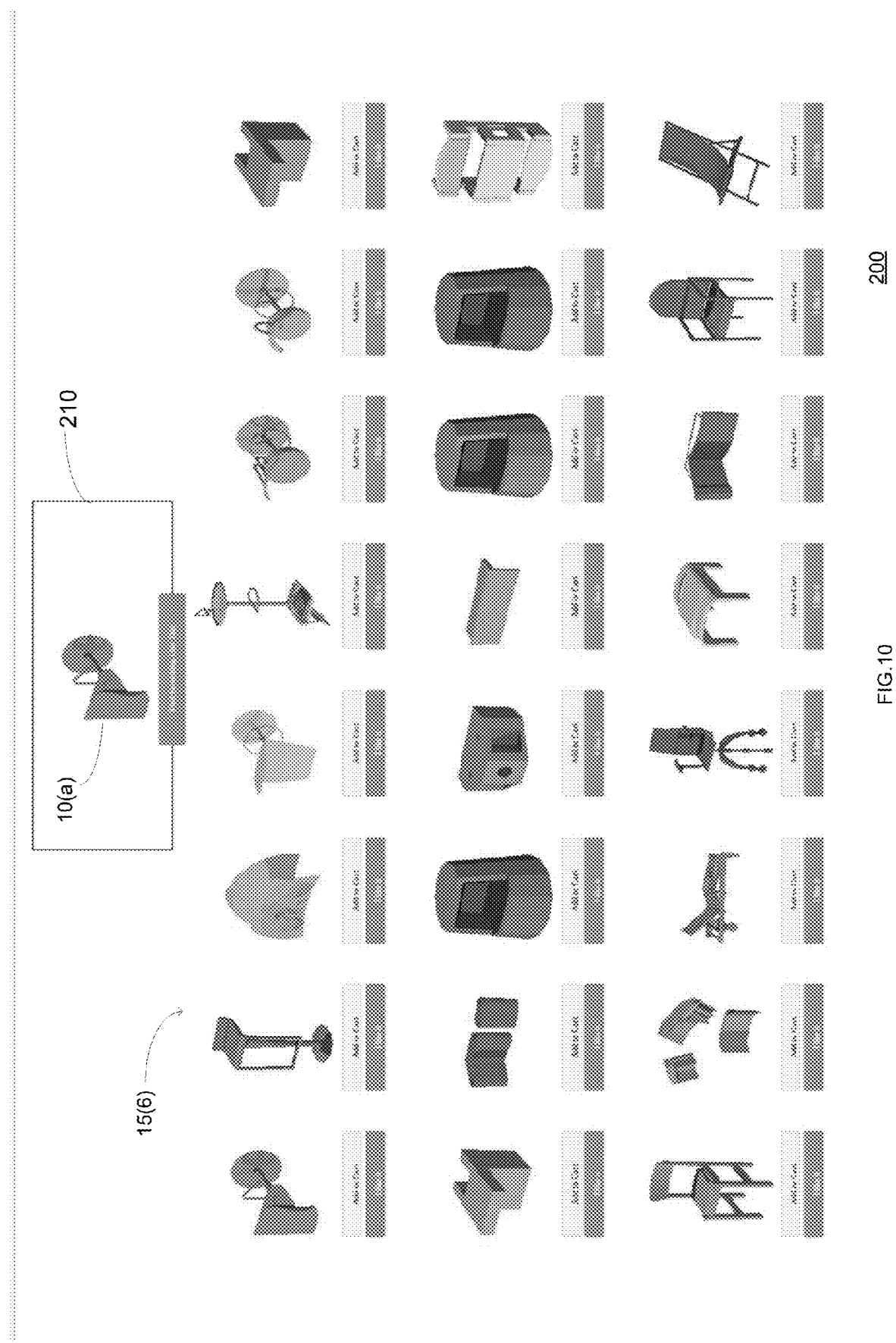

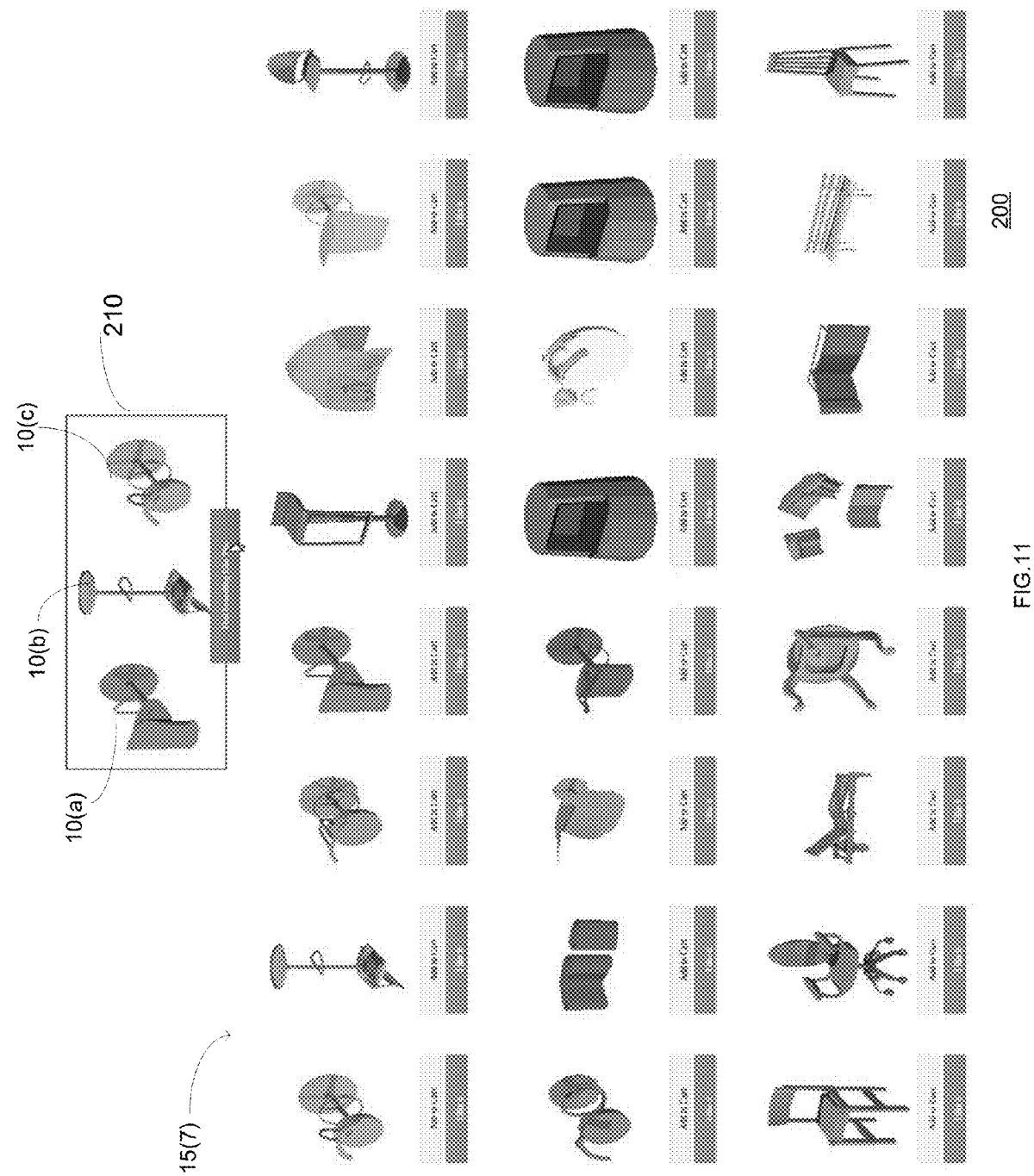

1

USER INTERFACE AND A METHOD FOR SEARCHING A MODEL

RELATED APPLICATIONS

A portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever. This application is a continuation in part of U.S. patent application Ser. No. 14/542,604 filing date Nov. 16, 2014 which is incorporated herein by reference.

BACKGROUND OF THE INVENTION

Three dimensional printers allow users to print three dimensional objects. A user can design the three dimensional object or search a model of the three dimensional object out of a pool of models of three dimensional objects.

There is a growing need to allow a user to search for a desired model of three dimensional objects.

SUMMARY

According to an embodiment of the invention there may be provided a non-transitory computer readable medium that stores instructions that once executed by a computer cause the computer to execute the stages of receiving or generating a first search result that may include a first set of representations of three dimensional objects; multiple representations of the first set may be virtually segmented to parts; receiving a search query that identifies a given part of one of the representations of the set; and generating, in response to the given part, a second search result.

The non-transitory computer readable medium may store instructions for displaying the first search result; and the displaying may include differentiating between different parts of the multiple representations.

The generating of the second search result may be preceded by allowing a selection, out of a set of search algorithms, of a search algorithm to be applied when generating the second search result.

The set of search algorithms may include a genus based search algorithm.

The second search result may include a second set of representations of three dimensional objects.

The non-transitory computer readable medium may store instructions for receiving a search query that identified a given representation of the second set; and generating, in response to the given representation, a third search result.

The representations of the first set may be compressed representations.

The non-transitory computer readable medium may store instructions for displaying a less-compressed representation of at least one representation of the first set.

The non-transitory computer readable medium may store instructions for generating the first search in response to a first search query that identifies multiple representations of multiple objects.

The non-transitory computer readable medium may store instructions for displaying an initial set of representation before receiving or generating the first search result.

The non-transitory computer readable medium may store instructions for generating the initial set of representation based upon clusters of objects that belong to a group of objects.

The non-transitory computer readable medium may store instructions for displaying the first search result while differentiating between different types of representations.

The different types may include images of objects and models of the objects.

The non-transitory computer readable medium may store instructions for displaying a set of images that display different views of at least one representation of the first set.

According to an embodiment of the invention there may be provided a computer that may include a processor and a memory module; the processor may be arranged to receive or generate a first search result that may include a first set of representations of three dimensional objects; multiple representations of the first set may be virtually segmented to parts; receive a search query that identifies a given part of one of the representations of the set; and generate, in response to the given part, a second search result; the memory module may be configured to store the first set of representations of three dimensional objects.

According to an embodiment of the invention there may be provided a method that may include receiving or generating, by a computer, a first search result that may include a first set of representations of three dimensional objects; multiple representations of the first set may be virtually segmented to parts; receiving a search query that identifies a given part of one of the representations of the set; and generating, in response to the given part, a second search result.

According to an embodiment of the invention there may be provided a non-transitory computer readable medium may store instructions that once executed by a computer cause the computer to execute the stages of receiving a selection, from a user, of multiple representations of multiple three dimensional objects; the multiple representations may be displayed to the user; calculating a representation of a merged object that virtually merges the multiple representations; and displaying the merged object to the user.

The merged object may include overlapping and non-overlapping parts.

The multiple representations may be virtually segmented to parts; the non-transitory computer readable medium stores instructions for receiving a search query that identifies a given part of one of the representations of a set; and generating, in response to the given part, a second search result.

According to an embodiment of the invention there may be provided a method the may include receiving a selection, from a user, of multiple representations of multiple three dimensional objects; the multiple representations may be displayed to the user; calculating a representation of a merged object that virtually merges the multiple representations; and displaying the merged object to the user.

According to an embodiment of the invention there may be provided a computer that may include a processor and a memory module; the processor may be arranged to receive a selection, from a user, of multiple representations of multiple three dimensional objects; the multiple representations may be displayed to the user; calculate a representation of a merged object that virtually merges the multiple representations; and participate in a displaying the merged object to the user; the memory module may be configured to store the merged object.

According to an embodiment of the invention there may be provided a non-transitory computer readable medium that may store instructions that once executed by a computer cause the computer to execute the stages of: receiving a search query that comprises information about multiple query models; wherein the multiple query models are selected out of a group of models of three dimensional objects; selecting, out of the group of models, a set of matching models based upon a similarity between each matching model and the multiple query models; and providing an indication related to the selecting of the set of matching models.

The providing of the indication may include displaying to a user the set of matching models of the three dimensional objects; wherein the non-transitory computer readable medium may store instructions for receiving from the user a selection of a selected model out of the set of matching models; and sending to a three dimensional printer information facilitating a printing of the selected model by the three dimensional printer.

The providing of the indication may include displaying to a user the set of matching models of the three dimensional objects; wherein the non-transitory computer readable medium may store instructions for receiving from the user a selection of a selected model out of the set of matching models; and printing by a three dimensional printer the selected model.

The non-transitory computer readable medium may store instructions for calculating similarities between models of the group of models and the multiple query models.

The calculating of similarities may include calculating relationships between a plurality of properties of the models of the group of models and a plurality of properties of query models of the multiple query models.

The calculating of the relationships between the plurality of properties of the models of the group of models and the plurality of properties of query models of the multiple query models may be responsive to distributions of properties among the group of models.

Each property of the plurality of properties of the models of the group of models may be represented by a Binary variable.

At least one property of the plurality of properties of the models of the group of models may be represented by a non-Binary variable.

The calculating of the relationships between the plurality of properties of the models of the group of models and the plurality of properties of query models of the multiple query models may be responsive to weights assigned to the plurality of properties of the models of the group of models.

The calculating of the relationships between the plurality of properties of the models of the group of models and the plurality of properties of query models of the multiple query models may be responsive to distributions of values of the plurality of properties of query models of the multiple query models.

The non-transitory computer readable medium wherein at least one property of a model of the group of models may be indicative of whether a certain structural element may be included in the model.

The non-transitory computer readable medium wherein at least one property of a model of the group of models may represent a color of the model.

The non-transitory computer readable medium wherein at least one property of a model of the group of models may represent a softness of the model.

The set of matching models may include models that may be most similar to the multiple query models.

The non-transitory computer readable medium may store instructions for selecting, out of the group of models, a set of additional models; and wherein the responding may be further responsive to the selecting of the set of additional models.

Properties of the group of models may span a space, properties of the set of matching models belong to a first subset of the space and properties of the set of additional models belong to a second subset of the space that differs from the first subset of the space.

The selecting of the set of the additional model may be responsive to distances of additional models to the first subset of the space.

The selecting of the set of the additional model and may be responsive to a desired distribution of models within the second subset.

The additional models and the matching models may be evenly distributed in the space.

The additional models and the matching models may be unevenly distributed in the space.

According to an embodiment of the invention there may be provided a system that may include a processor and a memory module; wherein the processor may be arranged to: receive a search query that may include information about multiple query models; wherein the multiple query models may be selected out of a group of models of three dimensional objects; select, out of the group of models, a set of matching models based upon a similarity between each matching model and the multiple query models; and provide an indication related to the selecting of the set of matching models.

The providing of the indication may include displaying to a user the set of matching models of the three dimensional objects; wherein the method may include receiving from the user a selection of a selected model out of the set of matching models; and sending to a three dimensional printer information facilitating a printing of the selected model by the three dimensional printer.

The providing of the indication may include displaying to a user the set of matching models of the three dimensional objects; wherein the method may include receiving from the user a selection of a selected model out of the set of matching models; and printing by a three dimensional printer the selected model.

The processor may be arranged to calculate similarities between models of the group of models and the multiple query models.

The calculating of similarities may include calculating relationships between a plurality of properties of the models of the group of models and a plurality of properties of query models of the multiple query models.

The calculating of the relationships between the plurality of properties of the models of the group of models and the plurality of properties of query models of the multiple query models may be responsive to distributions of properties among the group of models.

Each property of the plurality of properties of the models of the group of models may be represented by a Binary variable.

At least one property of the plurality of properties of the models of the group of models may be represented by a non-Binary variable.

The calculating of the relationships between the plurality of properties of the models of the group of models and the plurality of properties of query models of the multiple query models may be responsive to weights assigned to the plurality of properties of the models of the group of models.

The calculating of the relationships between the plurality of properties of the models of the group of models and the plurality of properties of query models of the multiple query models may be responsive to distributions of values of the plurality of properties of query models of the multiple query models.

At least one property of a model of the group of models may be indicative of whether a certain structural element may be included in the model.

At least one property of a model of the group of models may represent a color of the model.

At least one property of a model of the group of models may represent a softness of the model.

The set of matching models may include models that may be most similar to the multiple query models.

The method that may include selecting, out of the group of models, a set of additional models; and wherein the responding may be further responsive to the selecting of the set of additional models.

Properties of the group of models span a space, properties of the set of matching models belong to a first subset of the space and properties of the set of additional models belong to a second subset of the space that differs from the first subset of the space.

The selecting of the set of the additional model may be responsive to distances of additional models to the first subset of the space.

The selecting of the set of the additional model and may be responsive to a desired distribution of models within the second subset.

The additional models and the matching models may be evenly distributed in the space.

The additional models and the matching models may be unevenly distributed in the space.

According to an embodiment of the invention there may be provided a method that may include receiving, by a computer, a search query that may include information about multiple query models; wherein the multiple query models may be selected out of a group of models of three dimensional objects; selecting, out of the group of models, a set of matching models based upon a similarity between each matching model and the multiple query models; and providing an indication related to the selecting of the set of matching models.

The providing of the indication may include displaying to a user the set of matching models of the three dimensional objects; wherein the method may include receiving from the user a selection of a selected model out of the set of matching models; and sending to a three dimensional printer information facilitating a printing of the selected model by the three dimensional printer.

The providing of the indication may include displaying to a user the set of matching models of the three dimensional objects; wherein the method may include receiving from the user a selection of a selected model out of the set of matching models; and printing by a three dimensional printer the selected model.

The method may include calculating similarities between models of the group of models and the multiple query models.

The calculating of similarities may include calculating relationships between a plurality of properties of the models of the group of models and a plurality of properties of query models of the multiple query models.

The calculating of the relationships between the plurality of properties of the models of the group of models and the plurality of properties of query models of the multiple query models may be responsive to distributions of properties among the group of models.

Each property of the plurality of properties of the models of the group of models may be represented by a Binary variable.

At least one property of the plurality of properties of the models of the group of models may be represented by a non-Binary variable.

The calculating of the relationships between the plurality of properties of the models of the group of models and the plurality of properties of query models of the multiple query models may be responsive to weights assigned to the plurality of properties of the models of the group of models.

The calculating of the relationships between the plurality of properties of the models of the group of models and the plurality of properties of query models of the multiple query models may be responsive to distributions of values of the plurality of properties of query models of the multiple query models.

At least one property of a model of the group of models may be indicative of whether a certain structural element may be included in the model.

At least one property of a model of the group of models may represent a color of the model.

At least one property of a model of the group of models may represent a softness of the model.

The set of matching models may include models that may be most similar to the multiple query models.

The method that may include selecting, out of the group of models, a set of additional models; and wherein the responding may be further responsive to the selecting of the set of additional models.

Properties of the group of models span a space, properties of the set of matching models belong to a first subset of the space and properties of the set of additional models belong to a second subset of the space that differs from the first subset of the space.

The selecting of the set of the additional model may be responsive to distances of additional models to the first subset of the space.

The selecting of the set of the additional model and may be responsive to a desired distribution of models within the second subset.

The additional models and the matching models may be evenly distributed in the space.

The additional models and the matching models may be unevenly distributed in the space.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates various data elements according to an embodiment of the invention;

FIG. 9 illustrates a snapshot of a screen during an initialization stage of the method of FIG. 1 or 3 according to an embodiment of the invention;

FIG. 10 illustrates a snapshot of a screen that displays a query and a response to the query according to an embodiment of the invention; and FIG. 11 illustrates a snapshot of a screen that displays a query and a response to the query according to an embodiment of the invention;

DETAILED DESCRIPTION OF THE DRAWINGS

Figure 1:
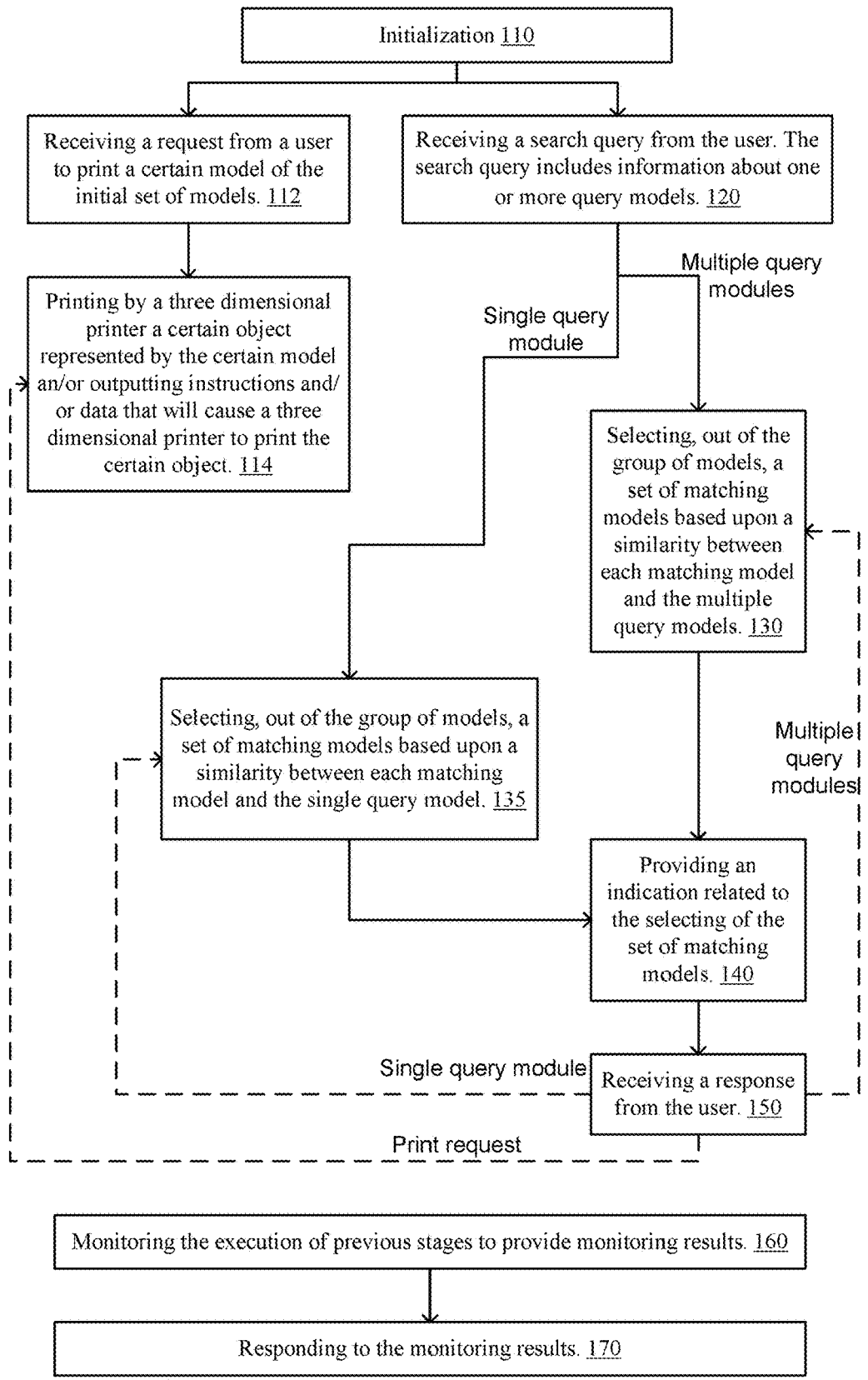
FIG. 1 illustrates a method according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term object refers to a three dimensional object. In the following text the phrase "object" and "three dimensional object" are used in an interchangeable manner.

The term "representation" is a representation of a three dimensional object. It is noted that the term "representation" may be used to refer to different types of representations, compressed and non-compressed representations of an object, and the like.

According to an embodiment of the invention there are provided methods, computers and non-transitory computer readable media that display to a user a compressed representations of three dimensional objects. The representations may be three dimensional models, images of the three dimensional models. The representations may be compressed representations such as but not limited to thumbnails, reduced facet representations, reduced resolution representations, and the like. The reduction in the facet and/or resolution is in relation to the representation stored in the database. The compressed representation eases the upload and download of the representation to the users device.

According to various embodiments of the invention the number of representations displayed on a screen may be responsive to the shape and size of the screen. The size and shape of a screen is known. The method may include over-estimating how many thumbnails can fit in a row, how many thumbnails may be in a columns and multiply these numbers. In case there are margins the method may factor these in to get a tighter bound. The over-estimating may be beneficial as it can provide some spare rows pre-loaded.

For example—the search results may include thumbnails. The user may select a more detailed representation of an object and this may result in uploading the three dimensional data of the object. The representation of can be rendered on a canvas modal over an application hosted by the user device.

Canvas is a term in javascript to an area of the screen which is rendered as an interactive image.

In the model there can be control icons such as a slider to control the opacity of the faces—allowing more visibility at times of inner information allowing more visibility at times of inner information or in cases of other obstructions. There's a 'refresh' button to reposition the model. Click and drag controller is available to rotate, translate and zoom in on the model. The refresh button is helpful for times when the model is goes out of view.

The thumbnails may be a decimated version of the object. The decimation may be independent of the file format (decimation may involve reducing the number of faces/vertices/edges).

The thumbnails may include almost all information needed to understand the object. This enables a quick overview of large collections of models which otherwise would require individual opening of each model. The thumbnail can be taken from an angle that supplies in a lot of cases (heuristically) a lot of information about the model. The images can be rendered with an anti-aliasing technique that gives them a pleasant and high quality look.

According to an embodiment of the invention, the state of the application hosted by the user device may be preserved in the URL. Meaning the native browser back and forward buttons work for navigating history. When loaded from a full link the application returns to the original state when the link was saved –3D models are fetched, inspected model is fetched, the search results and parameters are kept.

Each important state flag may be updated to the URL. Basically if the new query id is '17' for example we add to the URL a special flag called 'query' and assign it '17. Thus getting the URL search.yowza3d.com/#/?query=17. Everything beyond the'?' is a query parameter. Once the application is loaded from the previous link it loads back the query '17'-3D model, search results, parts, etc.

Using client side rendering and DOM manipulations frameworks allow to make the application that is hosted on the user device very low-latency in most cases where information from the server is not needed, and even when a remote call is made it is very small and quick.

According to an embodiment of the invention there are provided methods, computers and non-transitory computer readable media that display to a user an initial set of representations of three dimensional objects. The initial set is displayed to the user without receiving any search query from the user. The initial set of representations may be displayed when the user first browses to a web site. The initials set of representations may include representations that are selected randomly, pseudo-randomly, in response to previous searches of the user, in response to a profile of the user, in response to a clustering of a group of representations, and the like. The group of representations includes more representations than the initial set. The clustering may be calculated based upon similarities of representations to each other.

The initial set of representations may include one or more representations from each cluster, one or more representations form only part of the clusters, may include an equal number of representations from each cluster or an uneven number of representations from different clusters.

The clustering may result in getting a more varied set of representations than when using non-clustering algorithms. A unique object has higher chances of being included in the initial set.

According to an embodiment of the invention there are provided methods, computers and non-transitory computer readable media that display to a user, during different phases of a search process, different sets of representations of three dimensional objects. The entire set of a representation may be displayed to the user at once. Alternatively, the user may browse (for example scroll) between different parts of the set of the representation. The representations may be provided within a scroll section.

The number of representations that are displayed at once may be determined based upon the size of the screen of the user device, or based upon a size of a window that is opened on a user device display for displaying the representations.

According to an embodiment of the invention there are provided methods, computers and non-transitory computer readable media that display to a user, during one or more phase of a search process, different types of representations of three dimensional objects. The different types may include three dimensional models, and images of the three dimensional objects.

According to an embodiment of the invention different types of representations may displayed in different manners. For example, images of the three dimensional objects may be displayed at one region of the display while the three dimensional models may be displayed at another region of the display. Yet for another example—the images and the models may be displayed with different backgrounds, within windows of different shape and/or size.

According to an embodiment of the invention a search that starts by selecting one type of representation (for example—image or a model) will be followed by providing search results that include only representations of that one type (for example—images or models).

According to an embodiment of the invention there are provided methods, computers and non-transitory computer readable media that facilitate (a) a selection of multiple representations of multiple objects by a user, and (b) a display of an representation of a merged object that virtually merges the multiple representations—thereby emphasizing the spatial relationships between the multiple representations. The representation of the merged may include overlapping and non-overlapping parts. The merged object may be generated after virtually aligning the multiple representations with each other.

According to an embodiment of the invention there are provided methods, computers and non-transitory computer readable media that segment the representations to parts. Once a user selects a representation of a three dimensional object the representation as well as representations of virtually segmented parts of the objects are displayed. The representations of the virtually segments parts may be used as a search query.

According to an embodiment of the invention once a merged object is displayed then the virtually segmented parts of each one of the multiple representations associated with the merged object may be displayed and may even be used as search queries.

According to an embodiment of the invention multiple types of search queries may be provided. The search queries may include textual queries as well as selection of displayed items such as a representation of a three dimensional object or a representation of a virtually segments part of an object.

According to an embodiment of the invention each representation may be manipulated by the user. One or more control items may be displayed to the user and the user may control various aspects of the display of the representation of an object. Non-limiting example of such control items may include a rotation control icon, a transparency control icon, and the like.

According to an embodiment of the invention there are provided methods, computers and non-transitory computer readable media that facilitate a selection between different search algorithms. A user may elect which algorithm out of multiple algorithms to select. One of the search algorithms is a genus based search algorithm. Various search algorithms may differ from each other by the manner in which the representations of the objects are calculated.

According to embodiments of the invention there are provided methods, computers and non-transitory computer readable media that facilitate a genus based search. The search involves reducing ambiguities in genus calculation by removing orbifolds and/or by decimating a representation when the object has boundaries.

It has been found that allowing a user to submit a query with multiple query models can be highly beneficial—especially when the user is presented with multiple models of three dimensional objects but neither one of the presented models exactly matches the user's desire. Allowing a user to provide a query with multiple query models allows the user to better tune his request. This may allow the user to emphasize (by the selection of the multiple query models) properties he is more interested in. This may also allow the user to affect the range of differences between the models he is presented with—as selecting multiple query models that are more similar to each other may result in displaying to the user models that are more closely linked to each other.

FIG. 1 illustrates a method 100 according to an embodiment of the invention.

Method 100 may start by an initialization stage 110 during which a user is provided with an initial set of models.

The initial set of models may be determined in response to information provided from the user, previous queries provided by the user and/or other users, may be determined in an arbitrary manner or in any other manner.

The user may initiate method 100 by browsing to a web site for searching for a model to be printed by a three dimensional printer. The user may be presented with a web page that requests the user to enter the class of model he is interested to print.

For example, the user may indicate that he wishes to see models of chairs and stage 110 will include providing to the user (via a user device) with an initial set of models of chairs.

Stage 110 may be followed by stage 112 of receiving a request from a user to print a certain model of the initial set of models. In this case stage 112 may be followed by stage 114 of printing by a three dimensional printer a certain object represented by the certain model and/or outputting instructions and/or data that will cause a three dimensional printer to print the certain object.

Stage 110 may be followed by stage 120 of receiving a search query from the user. The search query includes information about one or more query models. A query model is a model that is referred to in the search query.

The user may select one or more models of the initial set of models as query modules. For example, the user may drag an image or icon of one or more models into a search window or otherwise make a selection or one or more query modules.

If the search query includes information about multiple query models the stage 120 is followed by stage 130. It is noted that the multiple query models are selected out of a group of models of three dimensional objects.

Stage 130 may include selecting, out of the group of models, a set of matching models based upon a similarity between each matching model and the multiple query models.

Stage 130 may be followed by stage 140 of providing an indication related to the selecting of the set of matching models.

Stage 140 may include displaying to a user the set of matching models of the three dimensional objects.

Additionally or alternatively, stage 140 may include sending instructions and/or information that will cause a user device to display the set of matching models.

If the search query of stage 120 includes information about a single query models the stage 120 is followed by stage 135. The single query model is selected out of the group of models of three dimensional objects.

Stage 135 may include selecting, out of the group of models, a set of matching models based upon a similarity between each matching model and the single query model.

Stage 135 may be followed by stage 140.

Stage 140 may be followed by stage 150 of receiving a response from the user.

The user may send a request from a user to print a certain model of the initial set of models. In this case stage 150 may be followed by stage 114 of printing by a three dimensional printer a certain object represented by the certain model and/or outputting instructions and/or data that will cause a three dimensional printer to print the certain object.

Additionally or alternatively, the user may send a new search query that may include information related to one or more query models.

If multiple query models are included in the search query then stage 150 may be followed by stage 130. If a single query model is included in the search query then stage 150 may be followed by stage 135.

It is noted that method 100 may include stage 160 of monitoring the execution of stages 110, 120, 130, 135, 140 and 150 to provide monitoring results. The monitoring results may provide an indication about the preferences of the user—which models he selected, which models were used as query models, which model the user selected to print.

Stage 160 may be followed by stage 170 of responding to the monitoring results. For example—affecting the selection of the set of the matching models of the user, of other users and the like.

Stage 130 may include at least one of the following:

(A) Calculating similarities between models of the group of models and the multiple query models. The similarities can be calculated between the multiple query models and each one of the group of models or between the multiple query modules and only a part of the group of modules. For example, the similarities may be calculated in an iterative manner wherein during each iteration similarity of only some of the models of the group are evaluated. A non-limiting example of such an iterative approach can be a lion in the desert algorithm.

(B) Calculating relationships between a plurality of properties of the models of the group of models and a plurality of properties of query models of the multiple query models. For example, assuming that the model is a chair than non-limiting examples of properties may include an inclusion (or absence of) of structural elements such as of arms, of a seat, of legs, of backs and the like. If there are multiple types of structural elements that are linked to each other (such as certain types of legs) then the properties may include an inclusion (or absence of) of different types of legs, arms, seats, backs and the like. Yet another examples of property may reflect the shape of a structural element, the color of the chair, the color of a structural element of the chair, the softness of the chair, the softness of the chair, a number of structural elements (for example 1 or more legs), and the like.

A similarity of a certain model of the group to the multiple query modules may reflect the similarity to the certain model to all of the multiple query modules.

A similarity of a certain model may be calculated in relation to each one of the query modules to provide multiple results that are further processed to provide the similarity between the certain model of the group and all of the multiple query modules. Alternatively, a representation of the entire multiple query modules can be calculated (for example—a center of gravity) and the similarity between the representation and the certain model is calculated.

Yet for another example, the representation of the entire multiple query modules may be an outcome of applying a function on properties of each one of the query modules. Non-limiting examples of such function may include mathematical functions, statistical functions, and the like. A function may be an averaging function, a weighted sum function, a function that may take into account statistical bias and/or statistical background and the like.

Each model of the group may be represented by a data structure such as a vector and/or matrix, wherein element of the data structure may provide an indication about a certain property of the model.

Zero or more properties may be represented by Binary variables (for example—does a chair include an arm of a certain type) while zero or more properties may be represented by non-Binary variables (for example—an indication of the softness of a seat may be represented by a non-binary variable).

The calculating of the relationships between the plurality of properties of the models of the group of models and the plurality of properties of query models of the multiple query models may include applying any algorithm.

The calculating of the similarity may include calculating relationships between the plurality of properties of the models of the group of models and the plurality of properties of query models of the multiple query models. This calculation (of similarity) may include calculating a "distance" between the data structures that represent the models involved in the calculation. The distance may be calculated by applying any known distance function.

The calculation may include calculating a representation of the similarity—such as a log likelihood estimate or any other estimate.

The calculating may be responsive to the distributions of properties among the group of models. For example—properties of one or more query models that are rarer (in relation to the properties of the models of the entire group) may be regarded as being of more importance than properties that are more common. For example—if all the chairs selected by the user include five legs then the number of legs (assuming that five legged chairs are not very common) will be of higher significance.

According to an embodiment of the invention the calculating may also be responsive to weights and/or priorities assigned to different properties.

The similarity calculation will be illustrated by the following non-limiting example and by FIG. 2.

It is assumed that:

(A) The models represent three dimensional chairs.
(B) The properties of each chair include six types of arms (properties arm1-arm6).
(C) There are four types of seats (properties seat1-seat4).
(D) There are five types of backs (properties back1-back5) and there are five types of legs (properties leg1-leg5).
(E) The different properties are mutually exclusive and represented by binary variables.
(F) Each model is represented by a vector V that has twenty variables-one per property.
(G) There are multiple N models 10(1)-10(N) in the group of models. The multiple models are represented by a matrix M 20 that has twenty columns 21(1)-21(20)—one column per property, and N rows 22(1)-22(N)—one per module. Columns 21(1)-21(6) represent arm1-arm6, columns 21(7)-21(11) represent seat1-seat4, columns 21(12)-21(16) represent back1-back5 and columns 21(17)-21(20) represent leg1-leg5.
(H) A current query listed four query modules 10(*a*), 10(*b*), 10(*c*) 10(*d*), wherein a,b,c,d differ from each other and range between 1 and N.

Models 10(*a*), 10(*b*), 10(*c*) and 10(*d*) are represented by vectors V(a), V(b), V(c) and V(d) 11(*a*), 11(*b*), 11(*c*) and 11(*d*).

The four query modules are represented by query vector Vq 12. Vq 12 is a function of vectors V(a), V(b), V(c) and V(d) 11(*a*), 11(*b*), 11(*c*) and 11(*d*). As indicated above Vq can be calculated by applying any function.

It will be assumed that Vq is calculated by: Calculating a weighted sum Ws 13 of V(a), V(b), V(c) and V(d). The weight may differ from one property to the other, may be the same for each property and the like. Normalizing each property of Ws 13 in response to the distribution of that property in matrix M to provide Ns 14.

According to an embodiment of the invention Vq may be calculated by:

$$Vq = Ws * \text{Log}(r*M + Ns*q), \quad (A)$$

wherein r and q are variable, wherein q differs from zero, wherein Log is a logarithmic operation.

Yet according to an embodiment of the invention the N similarities between each one of the N models of the group and the query models may be sorted for fast retrieval of the best X matching models, wherein X is the number of matching models. It is noted that the X matching models may differ from the best matching models and other criteria may be applied. For example, some of the matching models may be best matching models while some other may be matching but not best matching models.

According to an embodiment of the invention in addition to a selection of matching models the method may also select additional models. The additional models may be selected in response to their similarity to the one or multiple query models and/or in relation to an additional criterion. The additional criterion may reflect a desire distribution of models to be shown to the user. The desired distribution may include matching models as well as models that do not match the one or multiple query results and may belong to one or more subspaces of a space spanned by the group of models.

Assuming, for example that the properties of the group of models span a space (referring to the example below the space may be a 20 dimensional space that includes all the vectors that represent all of the models of the group of models) then the properties of the set of matching models may belong to a first subset of the space and properties of the set of additional models may belong to a second subset of the space that differs from the first subset of the space.

The selection of the additional models and of the matching models may be responsive to their distances from a representation of the one or multiple query models. For example—a desired distribution of additional models may specify distance ranges from Vq and the amount of additional models to be taken from each distance range. Yet for another example the selection of the additional vectors may be responsive to the distances of the matching models from Vq. For example—more compact distribution of the matching vectors may result in selecting additional models that are either closer to Vq or more distance from Vq.

The additional models and the matching models may be evenly or non-evenly distributed in the space.

Figure 3:
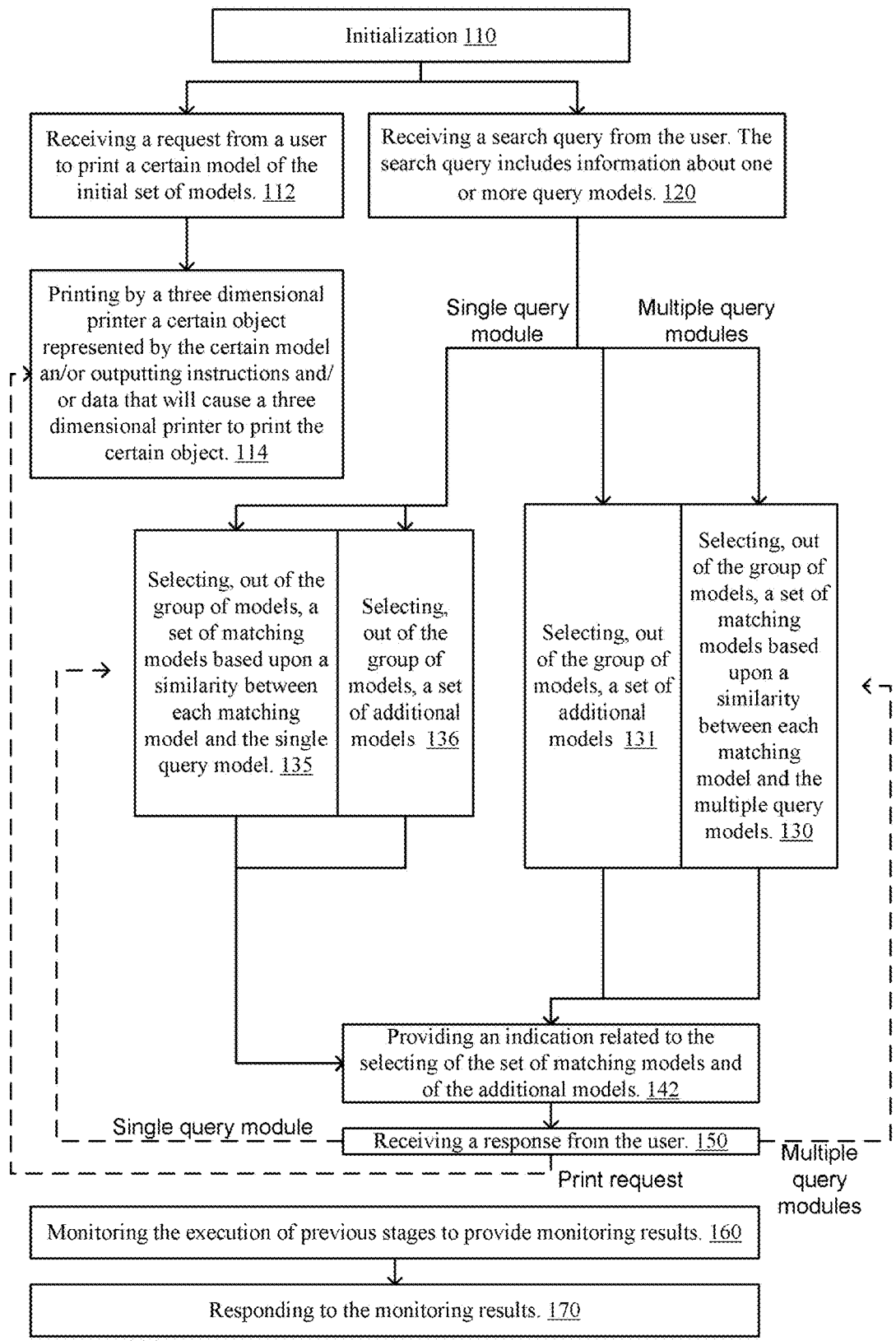
FIG. 3 illustrates a method according to an embodiment of the invention.

FIG. 3 illustrates method 102 according to an embodiment of the invention.

Method 102 differs from method 100 by the following differences:

Inclusion of stages 131 and 136 of selecting, one of the group of models, a set of additional models.

Stage 120 may be followed, if the user responded by providing a search query that included multiple query models by stage 130 (as in method 100) but also by stage 131.

Stage 120 is followed, if the user responded by providing a search query that included a single query model by stage 135 (as in method 100) but also by stage 136.

Stages 130, 131, 135 and 136 are followed by stage 142 (and not by stage 140) of providing an indication related to the selecting of the set of matching models and of the additional models.

Stage 150 is followed, if the user responded by providing a search query that included multiple query models by stage 130 (as in method 100) but also by stage 131.

Stage 150 is followed, if the user responded by providing a search query that included a single query model by stage 135 (as in method 100) but also by stage 136.

Method 102 may start by an initialization stage 110 during which a user is provided with an initial set of models.

Stage 110 may be followed by stage 112 of receiving a request from a user to print a certain model of the initial set of models. In this case stage 112 may be followed by stage 114 of printing by a three dimensional printer a certain object represented by the certain model and/or outputting instructions and/or data that will cause a three dimensional printer to print the certain object.

Stage 110 may be followed by stage 120 of receiving a search query from the user.

If the search query includes information about multiple query models then stage 120 is followed by stages 130 and 131.

Stage 130 may include selecting, out of the group of models, a set of matching models based upon a similarity between each matching model and the multiple query models.

Stage 131 may include of selecting, one of the group of models, a set of additional models.

Stages 130 and 131 may be followed by stage 14s of providing an indication related to the selecting of the set of matching models and of the selection of the additional models.

Stage 142 may include displaying to a user the set of matching models and of the additional models.

Additionally or alternatively, stage 140 may include sending instructions and/or information that will cause a user device to display the set of matching models and the set of additional models.

If the search query of stage 120 includes information about a single query models the stage 120 is followed by stages 135 and 136.

Stage 135 may include selecting, out of the group of models, a set of matching models based upon a similarity between each matching model and the single query model.

Stage 136 may include selecting, one of the group of models, a set of additional models.

Stages 135 and 136 may be followed by stage 142.

Stage 142 may be followed by stage 150 of receiving a response from the user.

The user may send a request from a user to print a certain model of the initial set of models. In this case stage 150 may be followed by stage 114 of printing by a three dimensional printer a certain object represented by the certain model and/or outputting instructions and/or data that will cause a three dimensional printer to print the certain object.

Additionally or alternatively, the user may send a new search query that may include information related to one or more query models.

If multiple query models are included in the search query then stage 150 may be followed by stages 130 and 131. If a single query model is included in the search query then stage 150 may be followed by stages 135 and 136.

It is noted that method 100 may include stage 160 of monitoring the execution of stages 110, 120, 130, 131, 135, 16, 140 and 150 to provide monitoring results. The monitoring results may provide an indication about the preferences of the user—which models he selected, which models were used as query models, which model the user selected to print.

Stage 160 may be followed by stage 170 of responding to the monitoring results. For example—affecting the selection of the set of the matching models of the user, of other users and the like.

Figure 4:
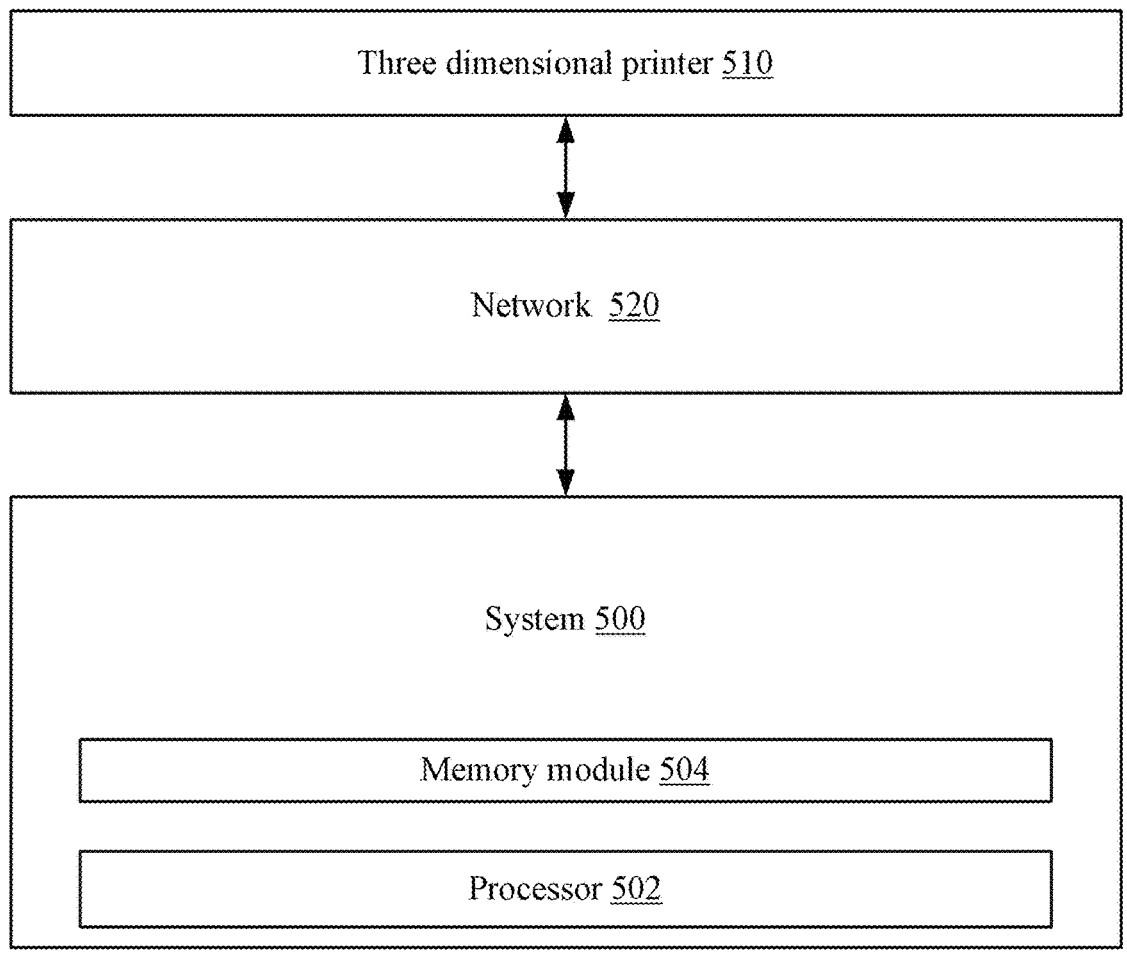
FIG. 4 illustrates a system according to an embodiment of the invention.

FIG. 4 illustrates the system 500 as being coupled to a three dimensional printer 510 and a network 520. It is noted that system 500 may be a part of the three dimensional printer 510.

The system 500 may be a computer such as a laptop, a desktop, a server, a mobile phone, a personal data assistant, a media player, or any system that may execute programs and communicate with other devices. The system 500 may be directly or indirectly accessed by a user. For example, the system 500 may be a server that can communicate with a user device that differs from system 500. Alternatively, the system may be a user device that includes a man machine interface (keyboard, screen, touch screen, mouse, voice activation interface, and the like). In the latter scenario the user device may be arranged to execute an application that allows the user to benefit from the computerized services of system 500.

Network 520 may be a wired network, wireless network, a combination of wired and wireless networks, a local area network, a wide area network, the Internet and the like.

Any of the methods may be executed by a system 500 that includes a processor 502 and a memory module 504. The processor may be a general purpose processor, a digital signal processor or a dedicated hardware (such as but not limited to a mathematical accelerator) arranged to perform the processing illustrated in the patent application.

FIGS. 5-11 are snapshots of screen 200 according to various embodiments of the invention.

Screen 200 includes a window 210 in which a user can drag a model when the user wishes to make that model a query model. After inserting one or more query models into window 210 that user may indicate that a search query including the models should be generated.

It is assumed that during an initializing stage window 210 is empty and that only a subset of the entire group of models is displayed to the user.

It is also assumed that the same amount of models are displayed to the user during the initialization stage and during the display of results (matching models and/or additional models) although the number of display models may change over time, between one iteration of methods 100 and 102 to the other, between initialization stage and responding the queries stages, and the like.

During each one of FIGS. 5-11 the user is provided with only a subset 15(1)-15(7) of the group of models.

Figure 5:
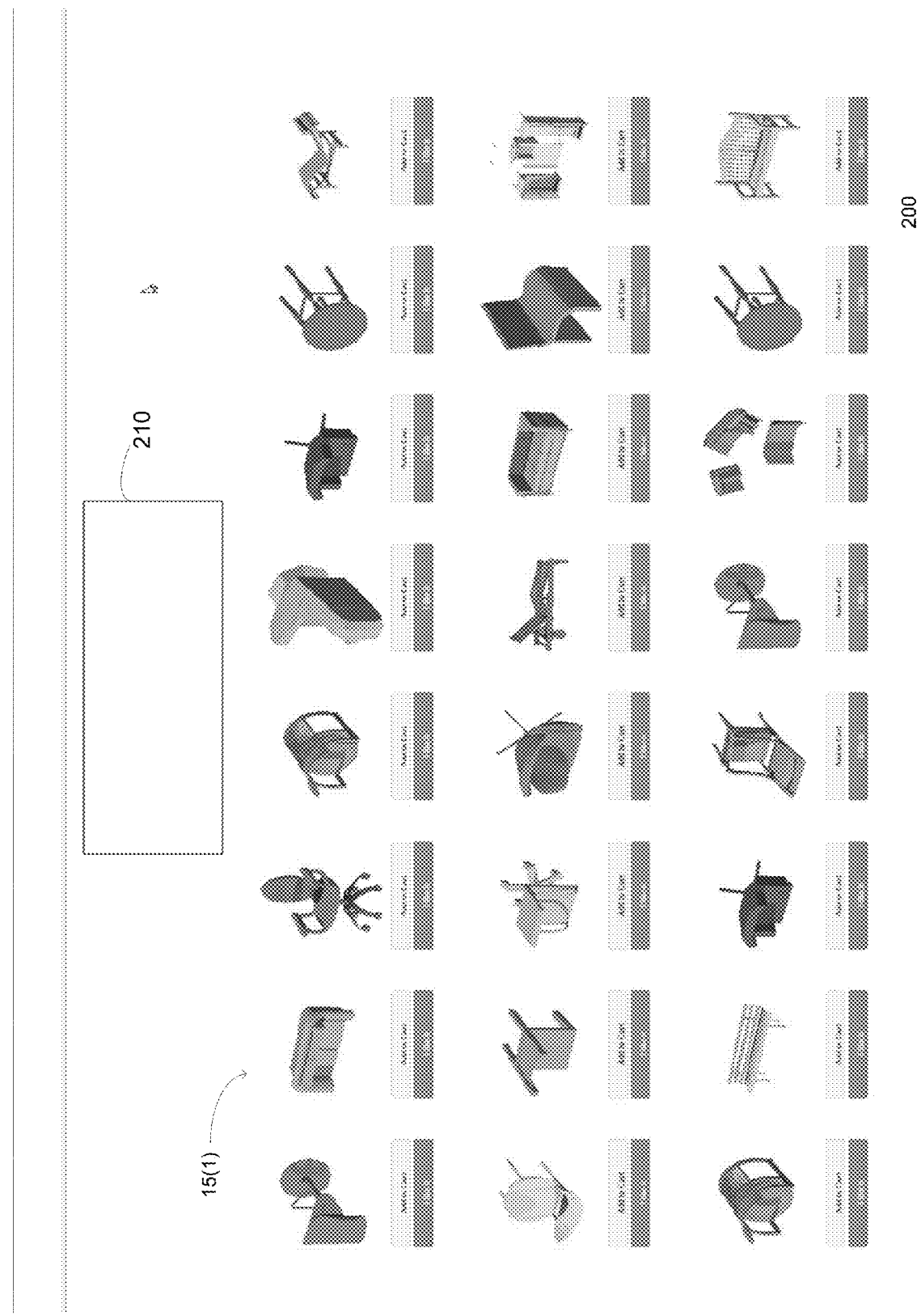
FIG. 5 illustrates a snapshot of a screen during an initialization stage of the method of FIG. 1 or 3 according to an embodiment of the invention.
Figure 6:
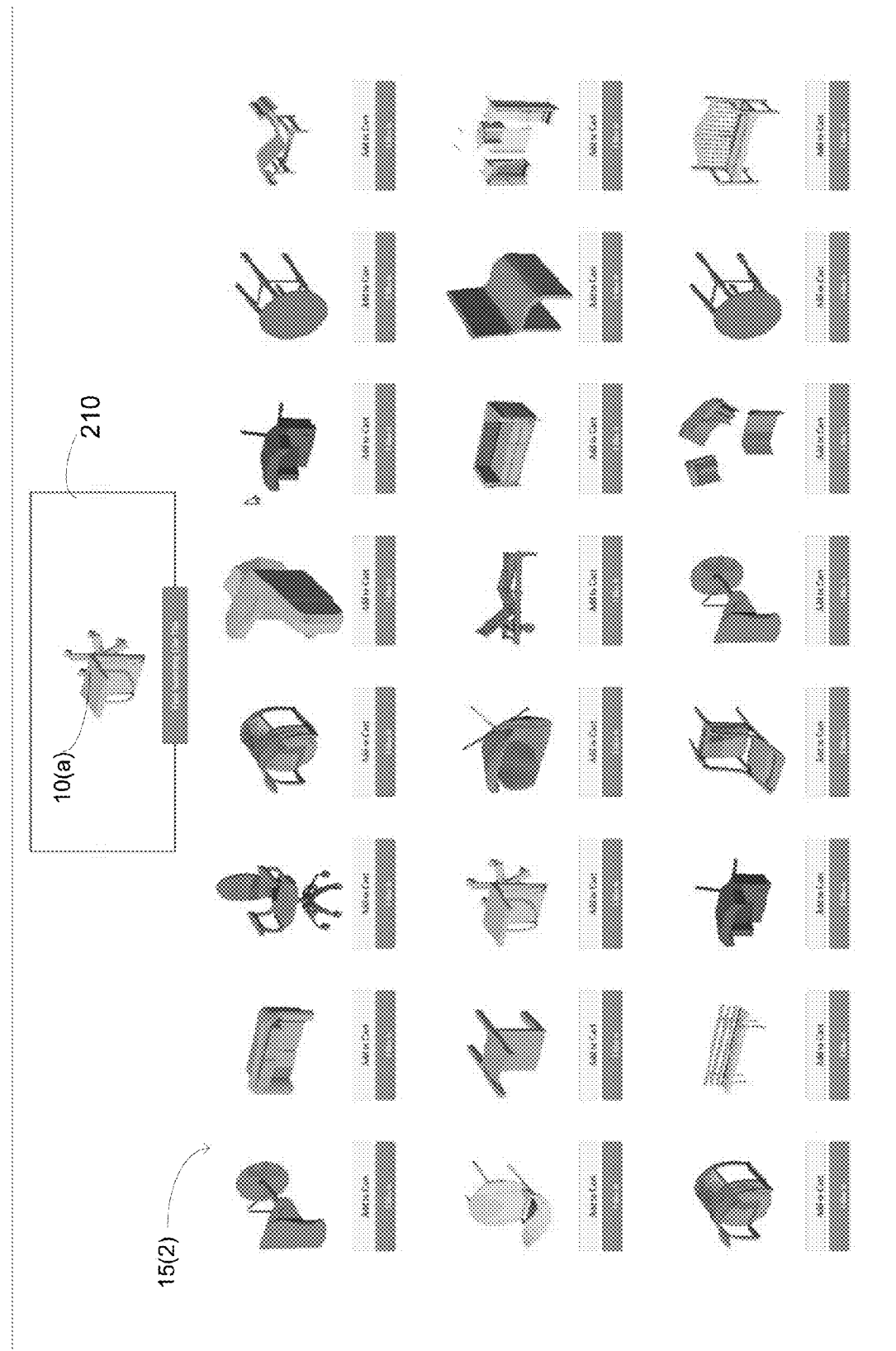
FIG. 6 illustrates a snapshot of a screen that displays a query and a response to the query according to an embodiment of the invention.
Figure 7:
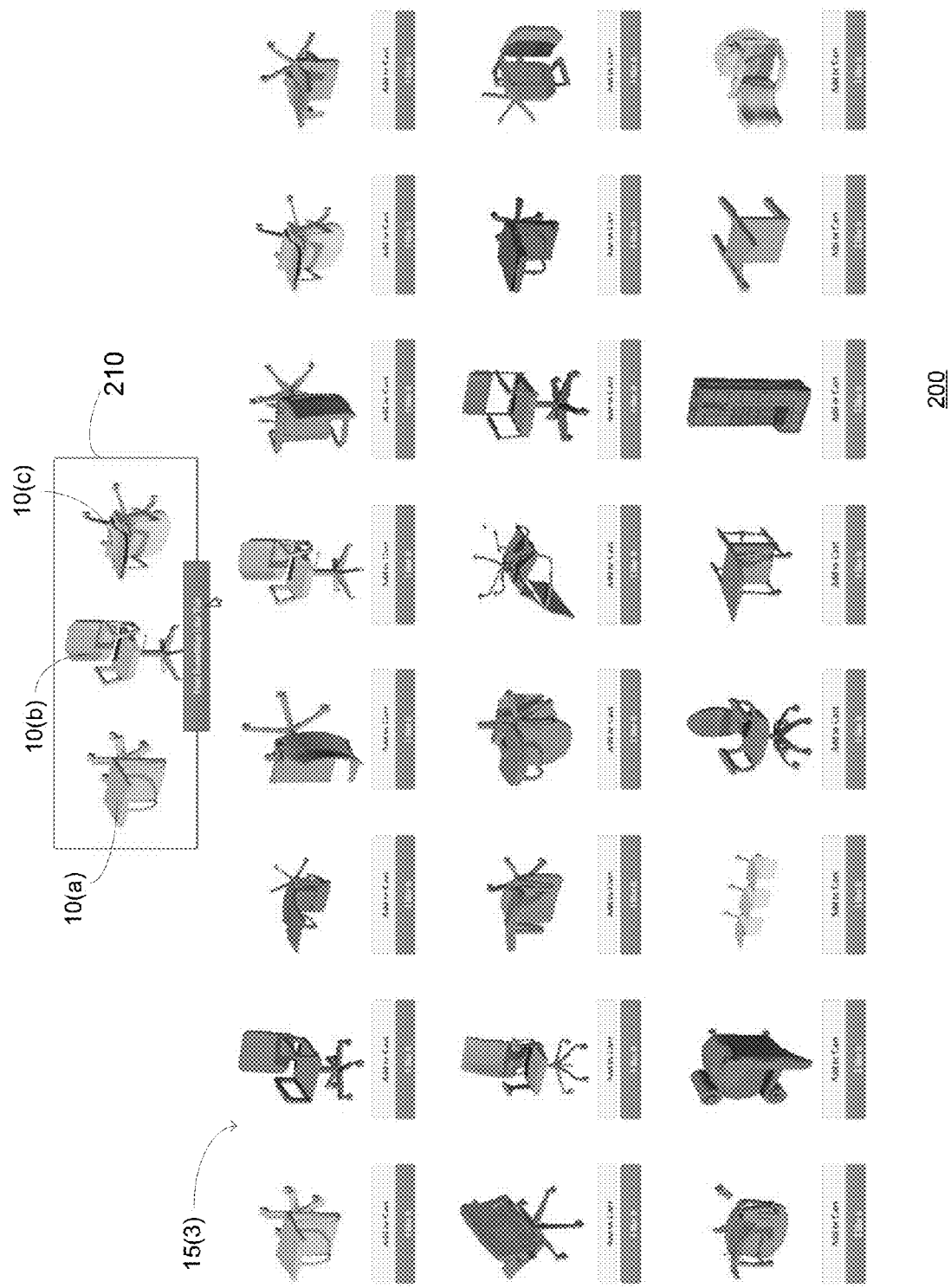
FIG. 7 illustrates a snapshot of a screen that displays a query and a response to the query according to an embodiment of the invention.
Figure 8:
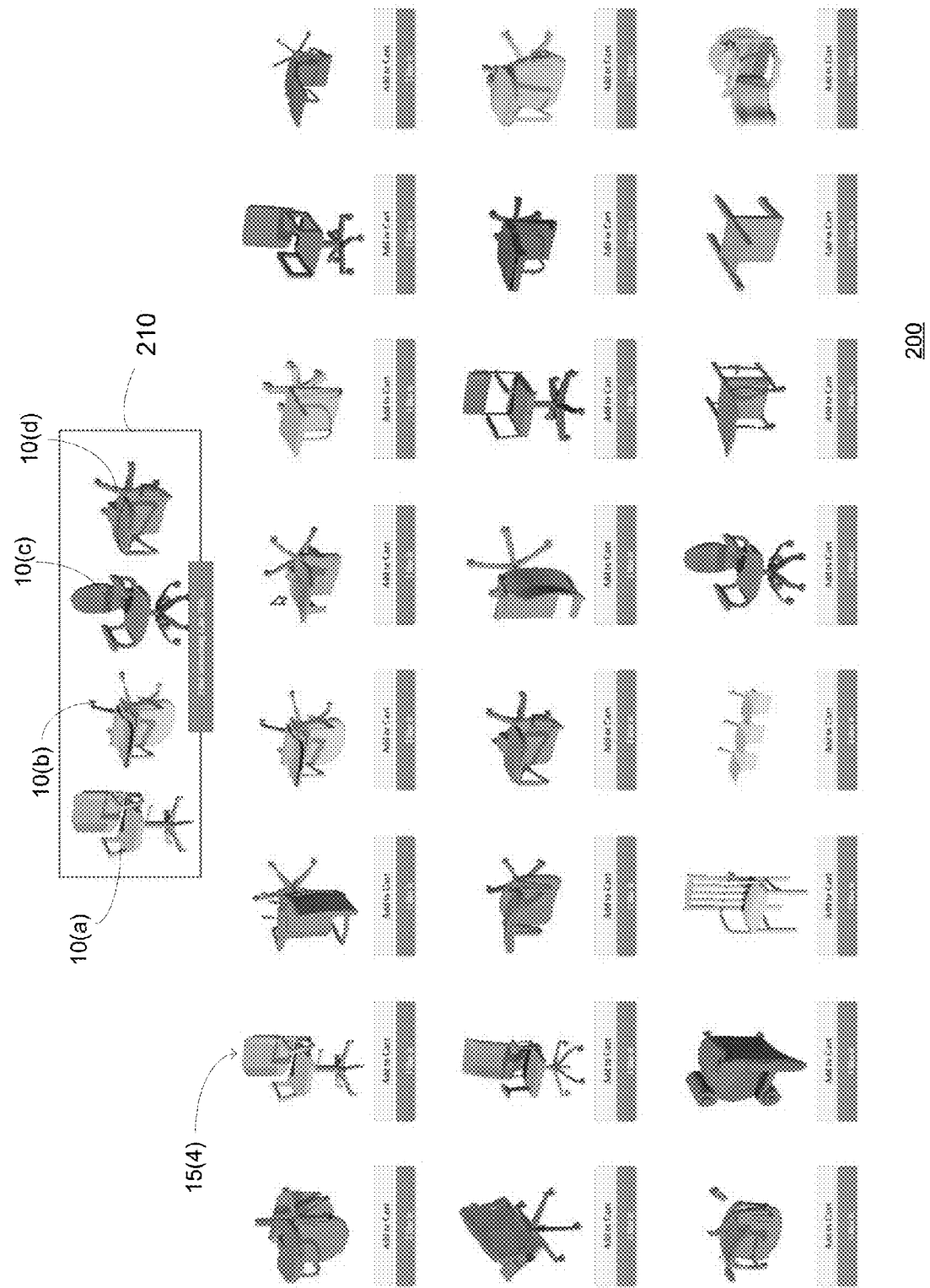
FIG. 8 illustrates a snapshot of a screen that displays a query and a response to the query according to an embodiment of the invention.

During each query the user may add one or more query model, remove one or more query models or maintain the same query models. FIG. 5 illustrates an initialization stage in which window 210 is empty, FIG. 6 illustrates a query that includes a single query model 10(a) and a response to the query, FIG. 7 illustrates a query that includes three query models 10(a),10(b) and 10(c) and a response to the query, FIG. 8 illustrates a query that includes four query models 10(a),10(b), 10(c) and 10(d) and a response to the query, FIG. 9 illustrates an initialization stage in which window 210 is empty, FIG. 10 illustrates a query that includes a single query model 10(a) and a response to the query and FIG. 11 illustrates a query that includes three query models 10(a),10(b) and 10(c) and a response to the query. FIGS. 5-11 may represent two sequences of search iterations—one sequence illustrated in FIGS. 5-8 and the other is illustrated in FIGS. 9-11.

At any stage the user may select to print a model. This may be done by pointing to the model or by any other manner known in the art.

In FIGS. 12A, 12B, 13A, 13B, 14, 15A, 15B, 16A, 16B, 17A, 17B, 18A, 18B, 19A, 19B, 20, 24A, 24B, 25A and 25B there are illustrated non-limiting embodiments of various screenshots. Any combination of any elements illustrated in any of these screenshots may be provided. Additionally or alternatively, any screen illustrated in these figures may include less areas, areas of different shapes, more areas and the like. For example, each screen may include more than a single main area, no secondary area, two or more secondary areas, and the like.

Figure 12A:
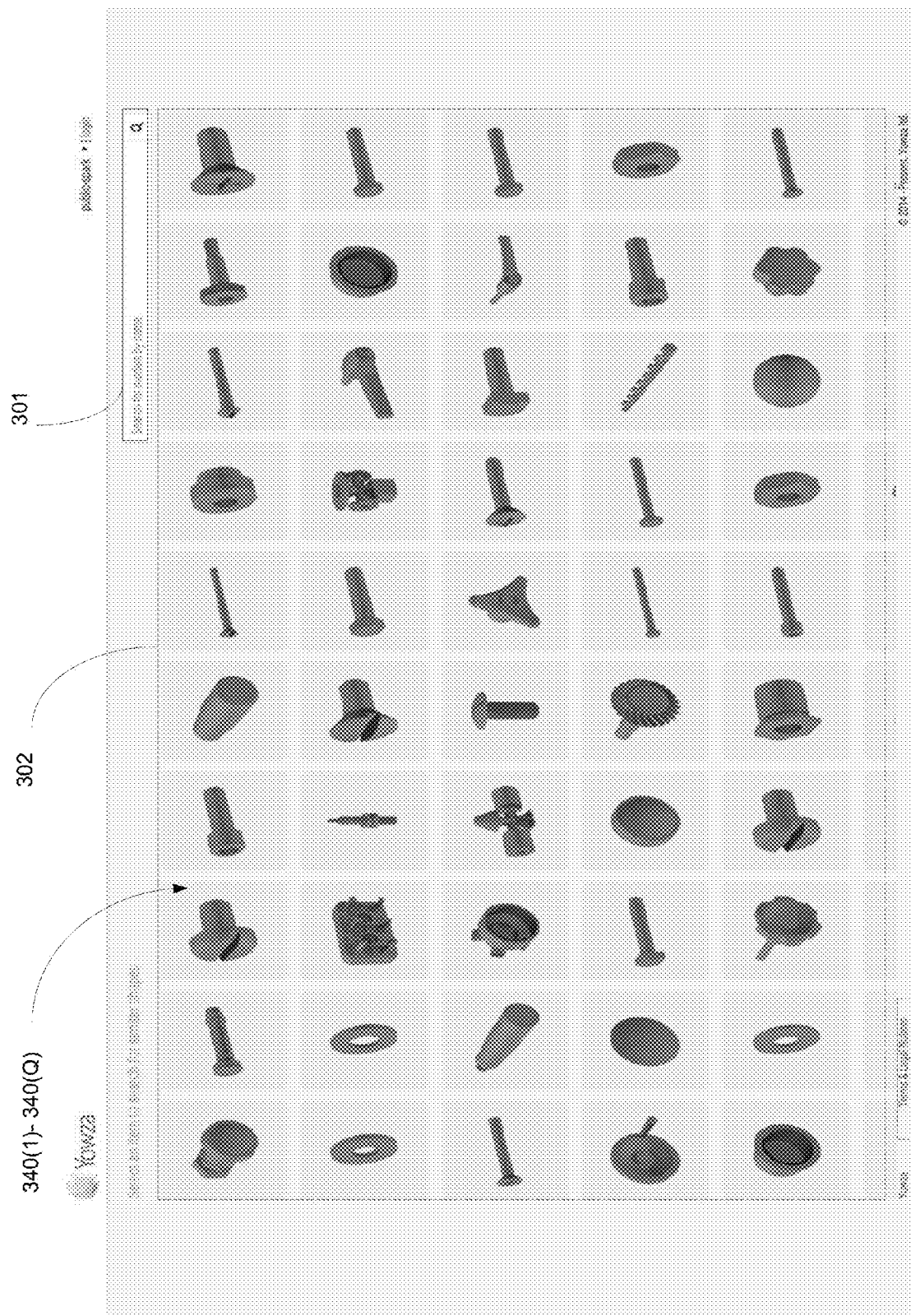
FIGS. 12A and 12B illustrate a snapshot of a screen that displays an initial set of representations according to an embodiment of the invention.

FIG. 12A illustrates a snapshot of screen 300(1) that displays an initial set of representations according to an embodiment of the invention.

Screen 300(1) includes text query window 301 for inputting textual search queries, a first area 302 for displaying representations 340(1)-340(Q) of an initial set of representations. Representations 340(1)-340(Q) may form the entire initial set of a part of the initial set. Representations 340(1)-340(Q) may be compressed representation. The user may request to view a non-compressed or less-compressed representation of one or more of representations 340(1)-340(Q).

In FIG. 12A representations 340(1)-340(Q) are three dimensional models. It is noted that the initial set may include models and/or images of the three dimensional objects.

In FIG. 12A the first area 302 spans along the majority of screen. It is noted that the first area 302 may have another shape and/or be of another size.

FIG. 12A also illustrated a link 304 to a terms and legal notice. Once selected by the user a document may be provided in a shared directory of service (for example GOOGLE™ DRIVE) and legal notice is displayed and may be edited.

The screen may also include user details and/or an identification of the dataset (group) of representations which can be accessed by the user.

Figure 12B:
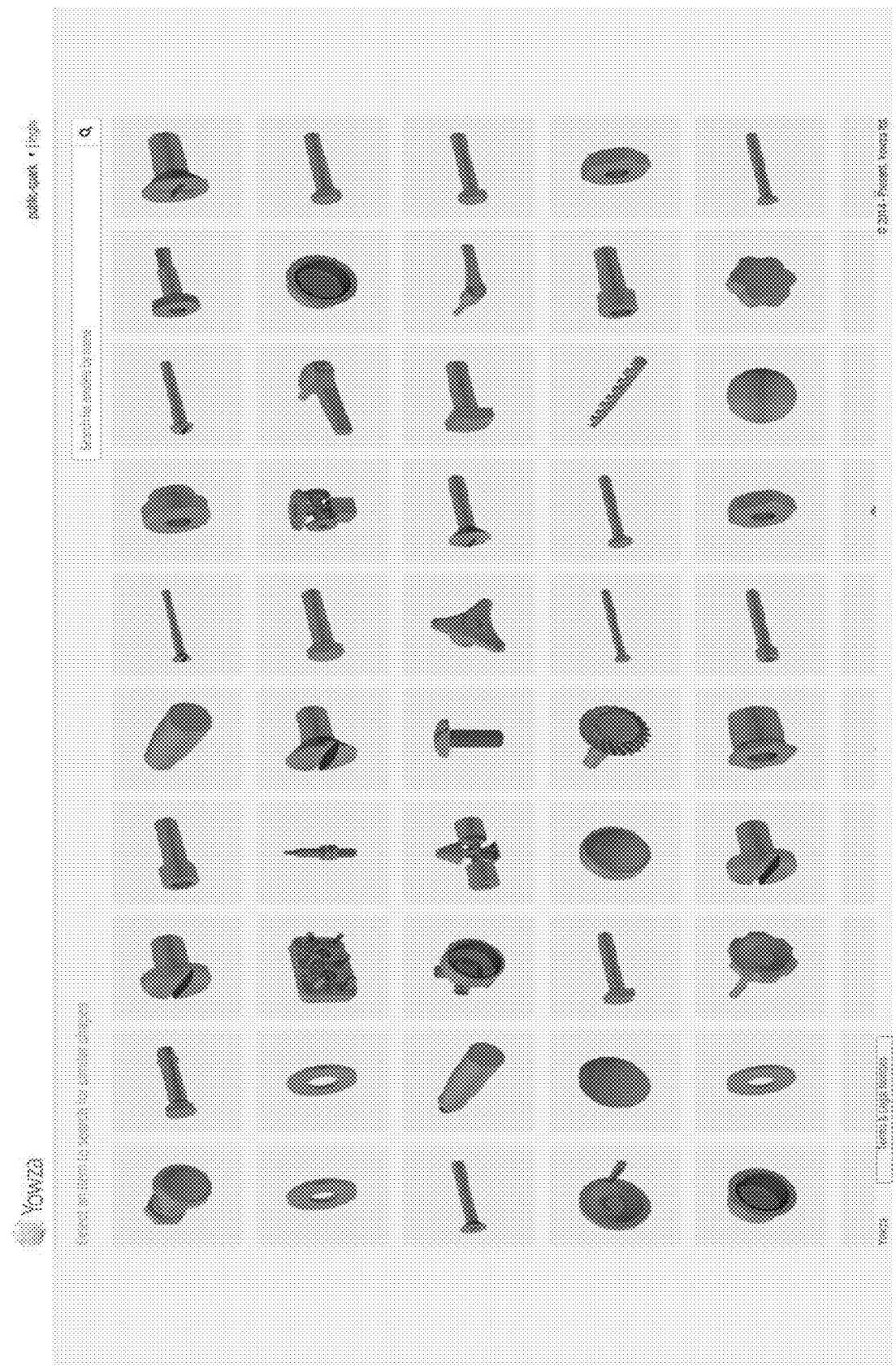

FIG. 12B illustrates the snapshot of screen 12A without reference numbers, boxes and arrows.

Figure 13A:
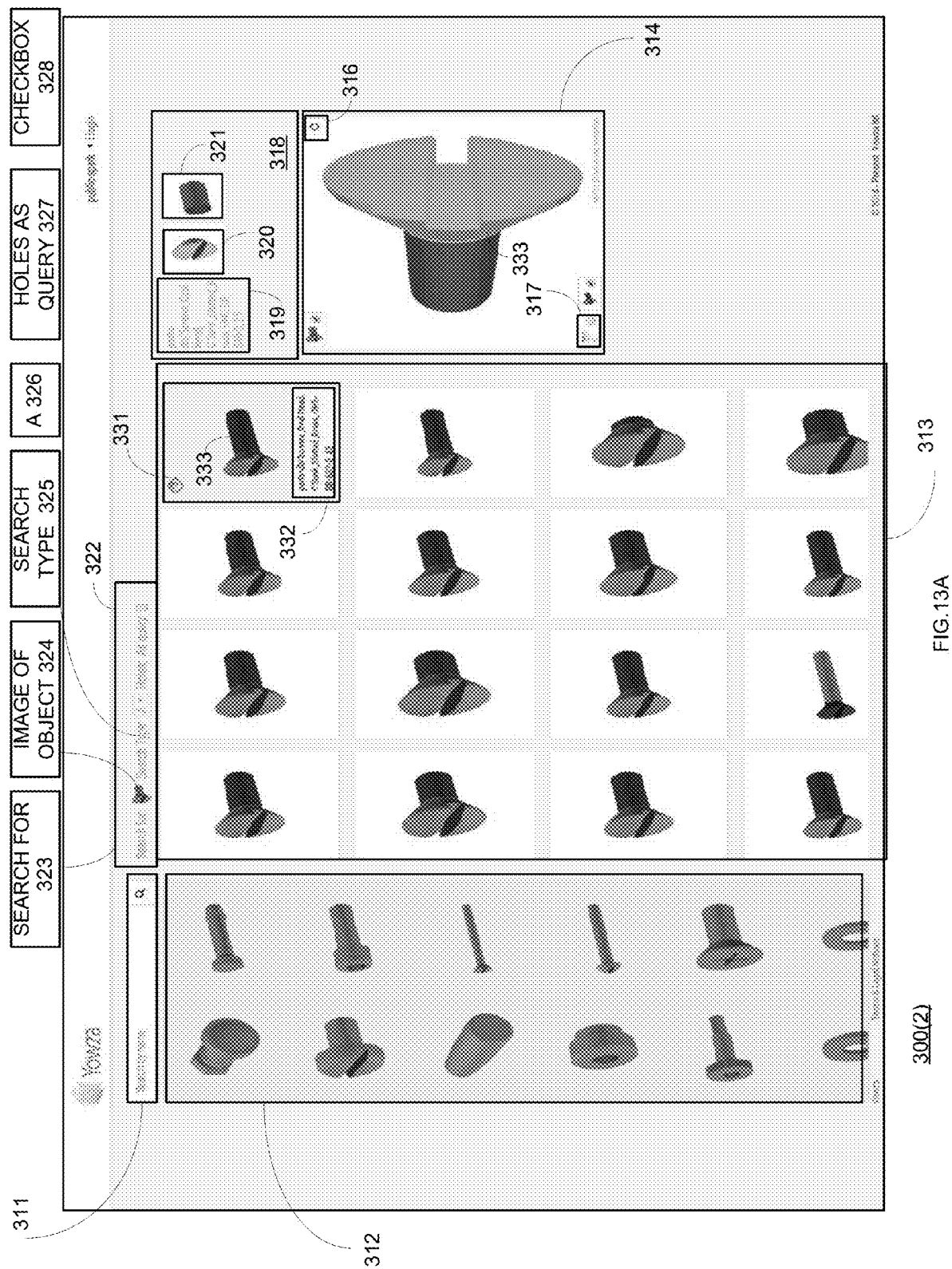
FIGS. 13A and 13B illustrate a snapshot of a screen that displays a search query that includes a selection of a representation of a screw and a search result according to an embodiment of the invention.

FIG. 13A illustrates a snapshot of screen 300(2) that displays a search query that includes a selection of a representation of a screw and a response to the search query according to an embodiment of the invention.

Screen 300(2) may include text query window 311, control icons area 322, main area 313, secondary area 312, parts area 318 and selected representation area 314.

The main area 313 may be used for displaying the result of a search query. The result includes multiple representations.

Each representation may be displayed within a window that may include one or more control icons such as a control icon 331 for selecting the representation as a part of a merged object. The window may display, in addition to the representation 333, the name 332 of the representation (parts-db/Screws_Oval Head, C'Sunk_Slotted_Brass_OHS-BR-632-O_43").

The parts area 318 displays the different parts that form the object. In FIG. 13 there are two parts-displayed within windows 320 and 321. Parts area 318 also displays the names 319 of one or more of the parts.

The selected representation area 314 provides an enlarged image of the selected representation 333. The user may select the selected representation 333 out the multiple representations displayed within main area 313.

The selected representation may rotated, may have its transparency level set (by control icon 317). Control icon 316 may reset the rotation (to an original or default rotation) and the mouse is the main control for the rotations.

The control icons area 322 is used to indicate the selected search query and to select a search algorithm to be applied when responding to a search query.

Text box "search for" 323 is followed by a miniature image (image of object 324) of the selected representation.

Text box "search type" 325 may be followed a selection window 326 (in FIG. 13 the selected search algorithm was denoted A).

In addition a genus search may be requested by filling checkbox 328 (preceded by text box "holes as query" 327).

Main area 313 and secondary area 312 are used for displaying different types of representations of the same objects. Alternatively—the representations of different objects may be shown in areas 312 and 313. Although in FIG. 13 both main area 313 and secondary area 312 show three dimensional objects—it is not necessarily so.

Furthermore—in FIG. 13A the main area 313 shows models in which different parts are colored in different colors while secondary area 312 illustrates single colored models.

Figure 13B:
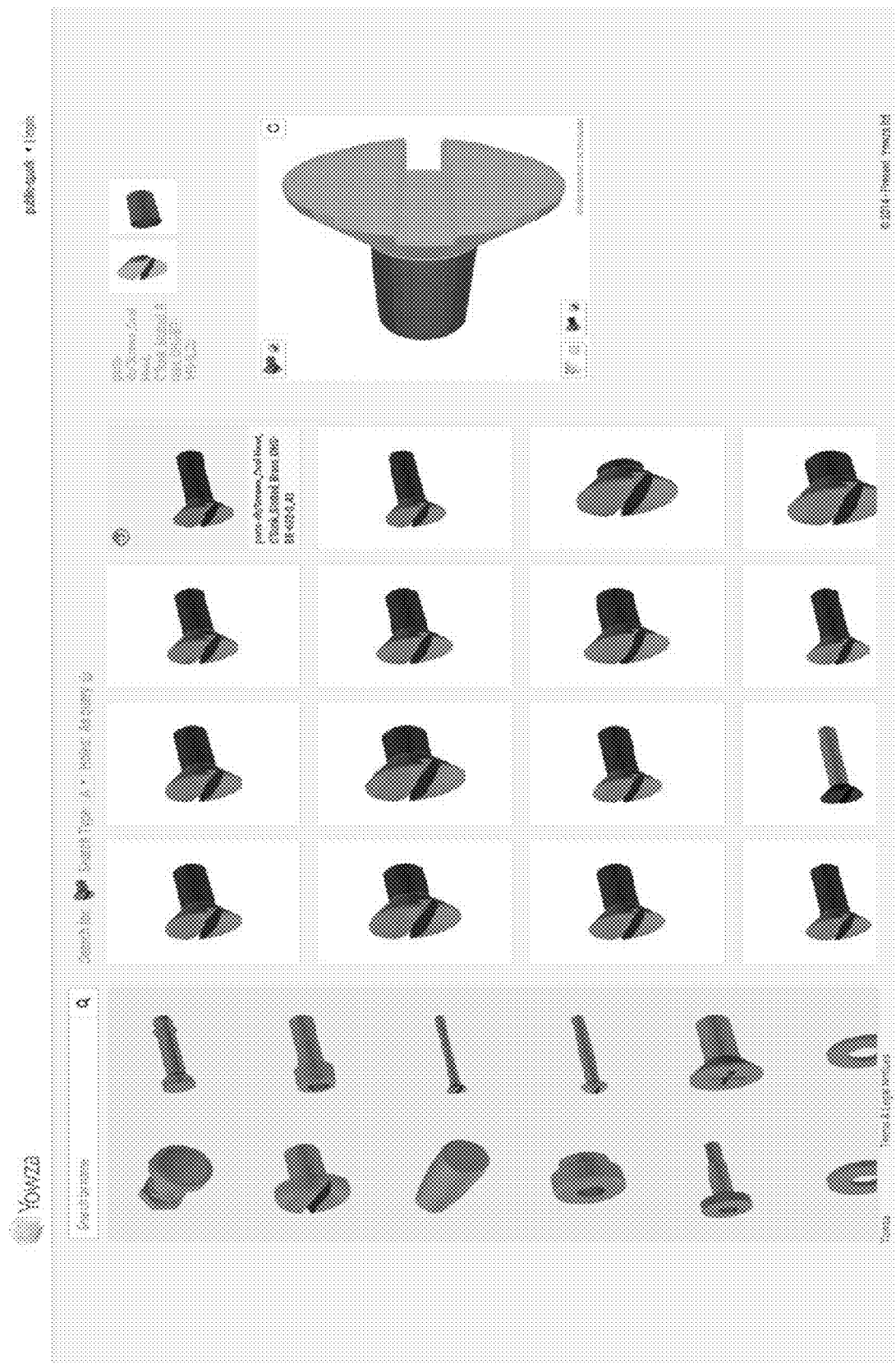

FIG. 13B illustrates the snapshot of screen 200(2) without reference numbers, boxes and arrows.

Figure 14:
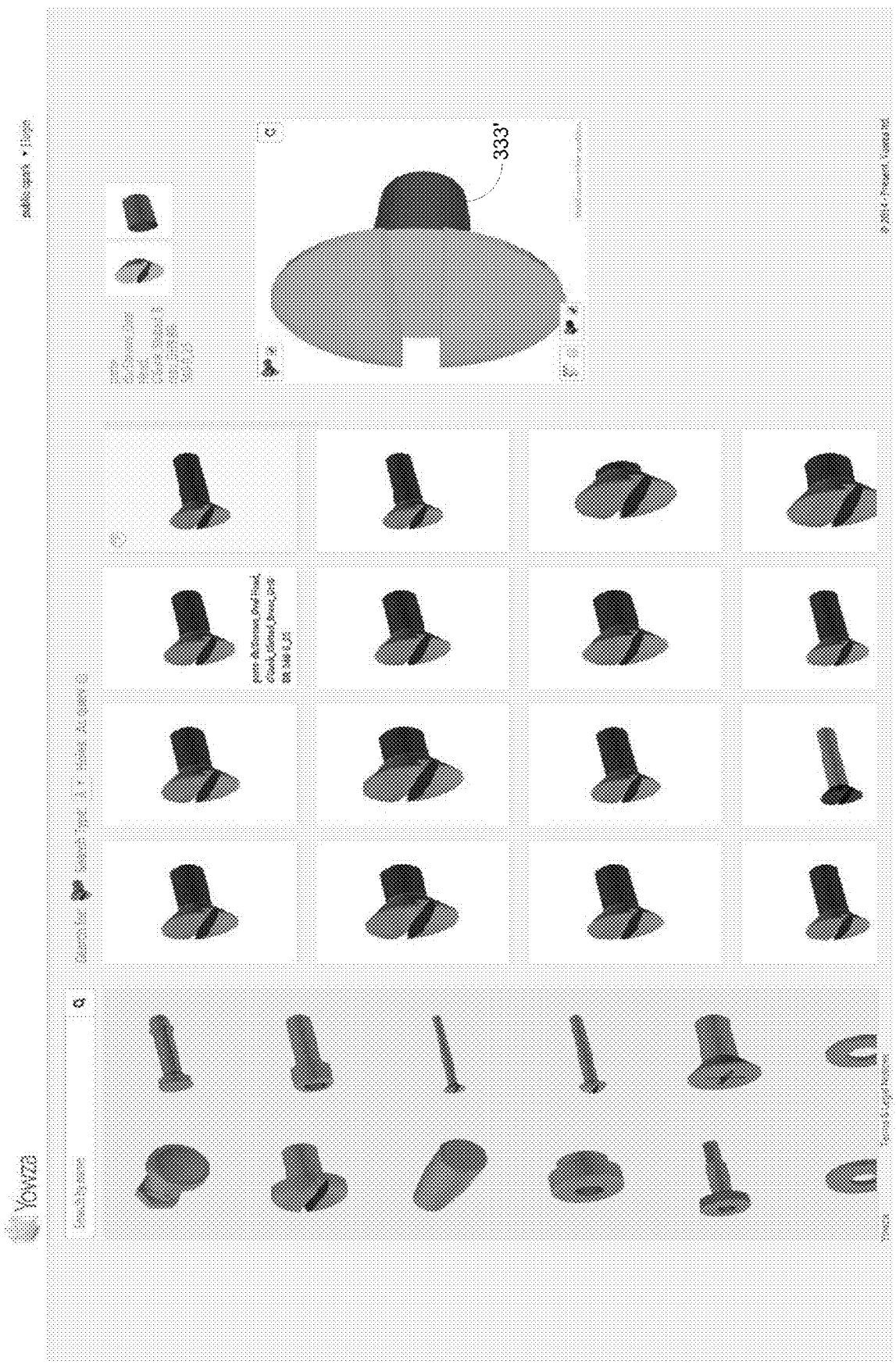
FIG. 14 illustrates a snapshot of a screen that displays a search query that includes a selection of a representation of a screw and a search result according to an embodiment of the invention.

FIG. 14 illustrates a snapshot of a screen 300(3) that displays a search query that includes a selection of a representation of a screw and a response to the search query according to an embodiment of the invention. Screen 300(3) differs from screen 300(2) by the rotation of the selected representation (now denoted 333') within the selected representation area 314.

Figure 15A:
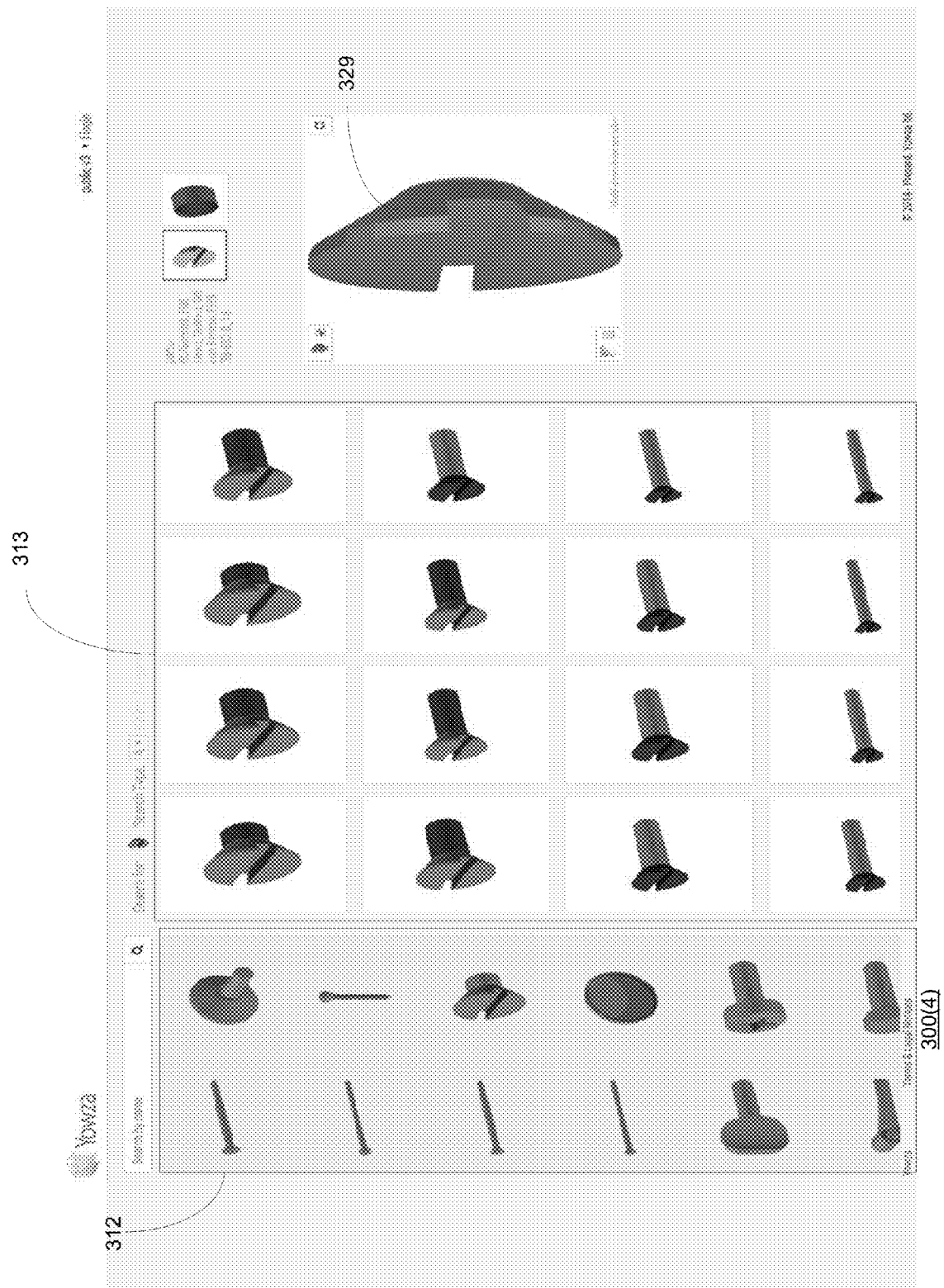
FIGS. 15A and 15B illustrate a snapshot of a screen that displays a search query that includes a selection of a representation of a part of the screw of FIG. 14 and a search result according to an embodiment of the invention.

FIG. 15A illustrates a snapshot of a screen 300(4) that displays a search query that includes a selection of a representation of a part of the screw of FIG. 14 and a response to the search query according to an embodiment of the invention.

The head of the screw (previously displayed in window 320 of FIG. 13A) was selected by a user as a search query and in FIG. 15 the head 329 of the screw is displayed in the selected representation area 314.

Main area 313 and secondary area 312 display search results obtained when using the head of the screw as the search query.

Figure 15B:
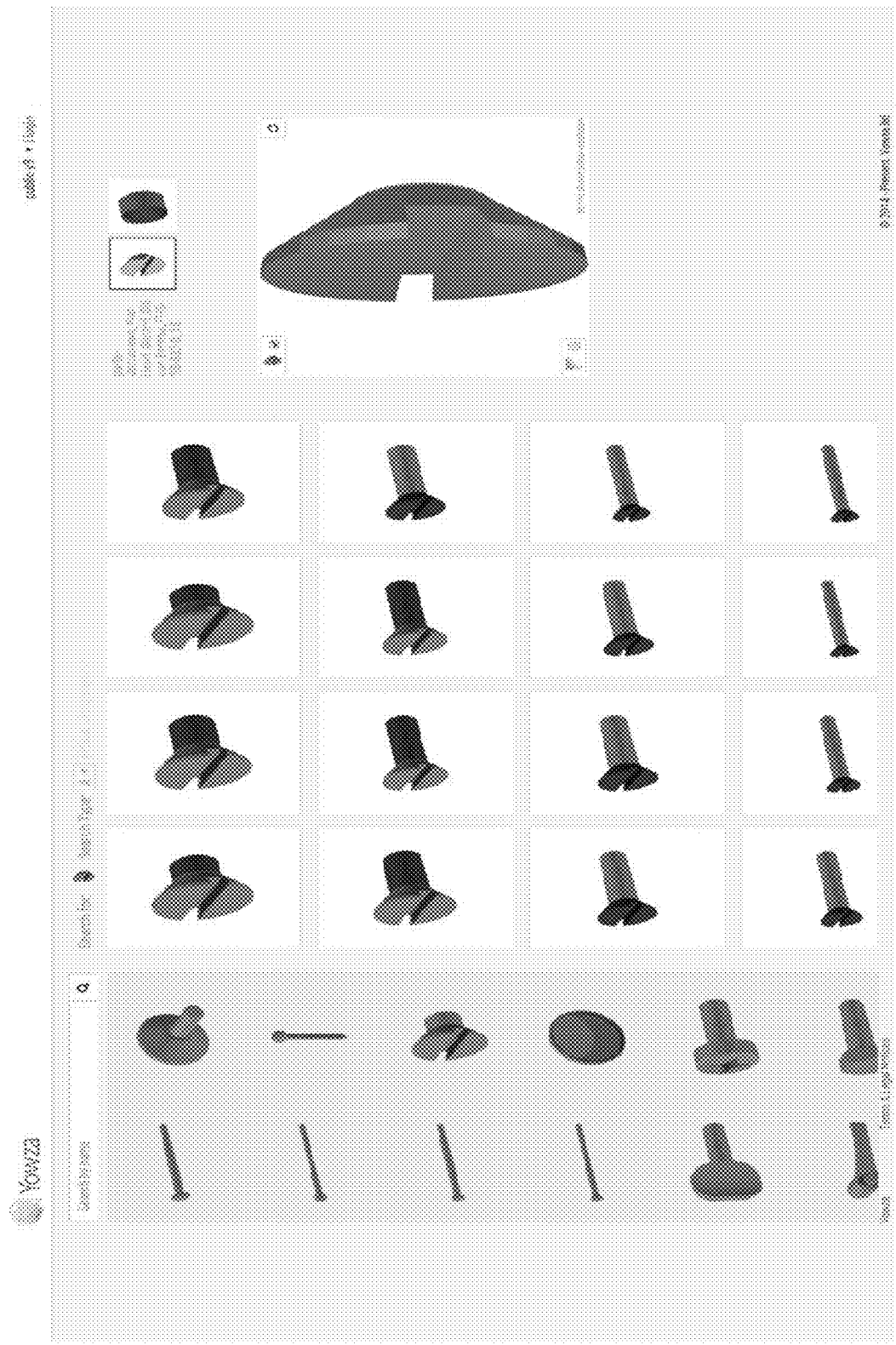

FIG. 15B illustrates the snapshot of screen 300(4) without reference numbers, boxes and arrows.

Figure 16A:
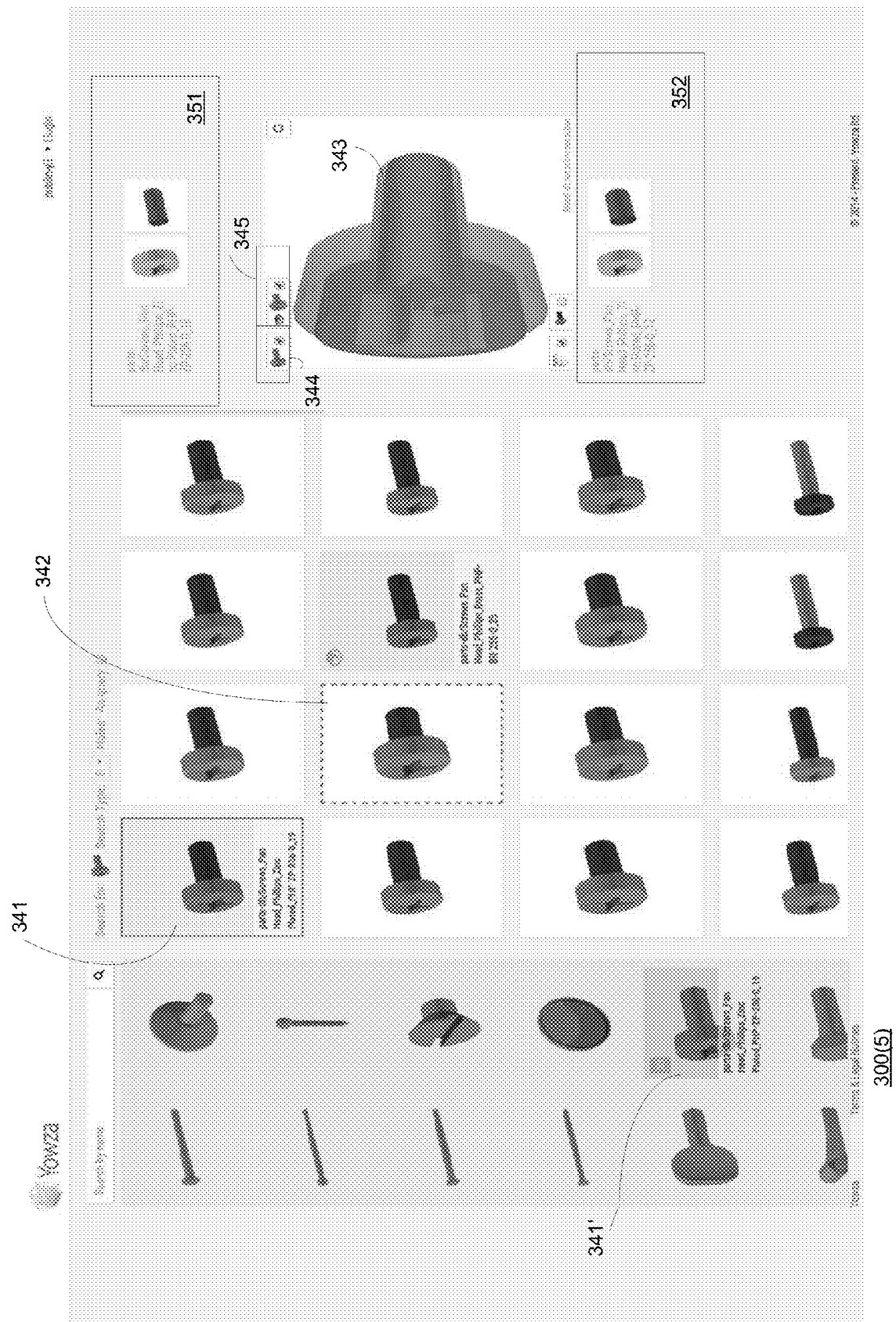
FIGS. 16A and 16B illustrate a snapshot of a screen that displays a representation of a merged object according to an embodiment of the invention.

FIG. 16A illustrates a snapshot of a screen 300(5) that displays a representation of a merged object according to an embodiment of the invention.

Screen 300(5) illustrates merged object 343.

Merged object 343 is displayed within the selected representation area 314 and shows overlapping and non-overlapping areas between two representations—first representation 341 and second representation 342—both displayed within main area 313.

The selected representation area 314 also includes miniature images 344 and 345 of the first and second representations 341 and 342.

Parts area 351 of screen 300(5) illustrates the parts of first representation 341 and an additional parts area 352 illustrates the parts of second representation 342. Each part may be used as a search query.

In FIG. 16A the secondary area is illustrated as including another representation 341' of the object that is represented by first representation 341.

Figure 16B:
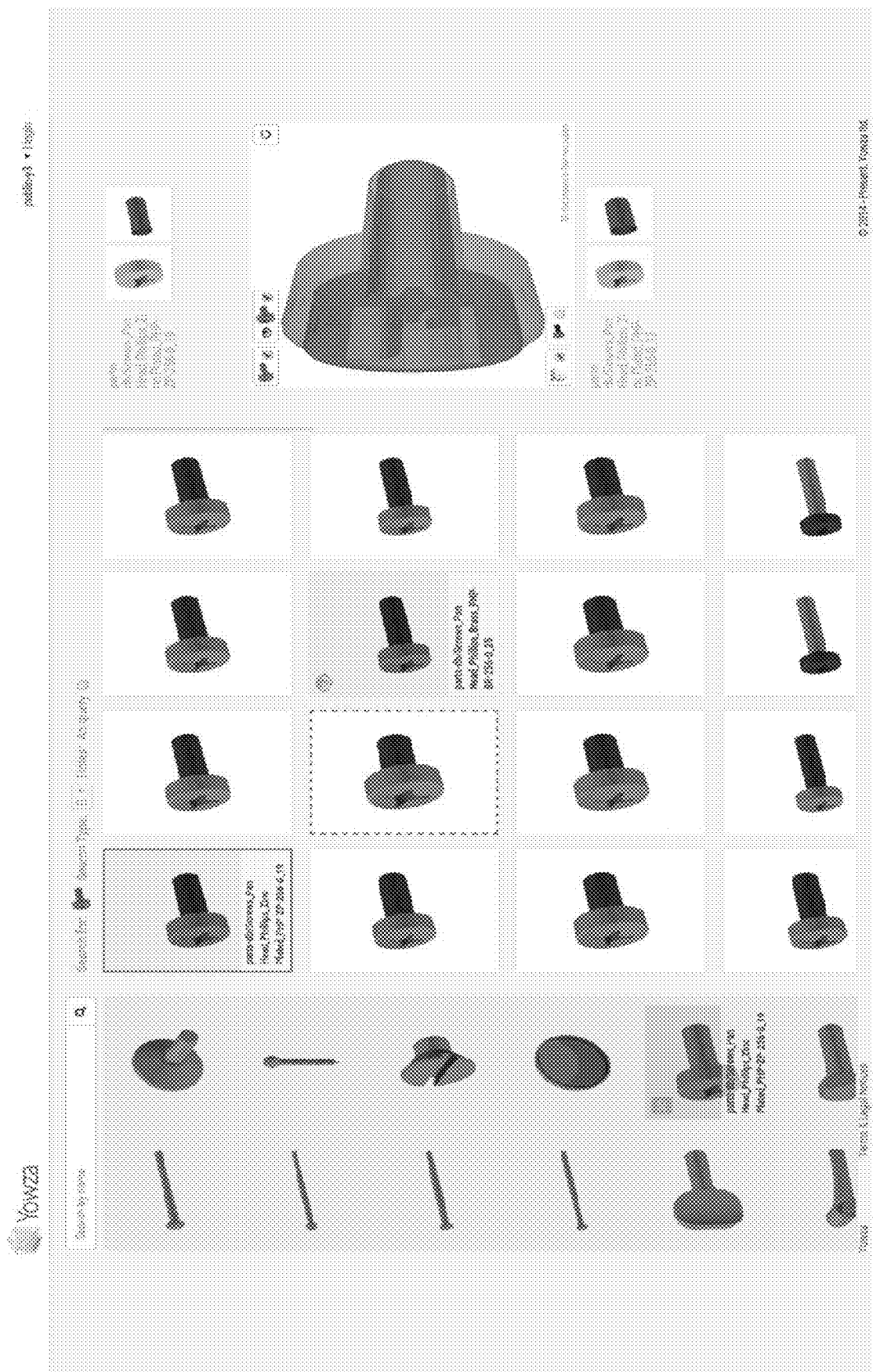

FIG. 16B illustrates the snapshot of screen 300(5) without reference numbers, boxes and arrows.

Figure 17A:
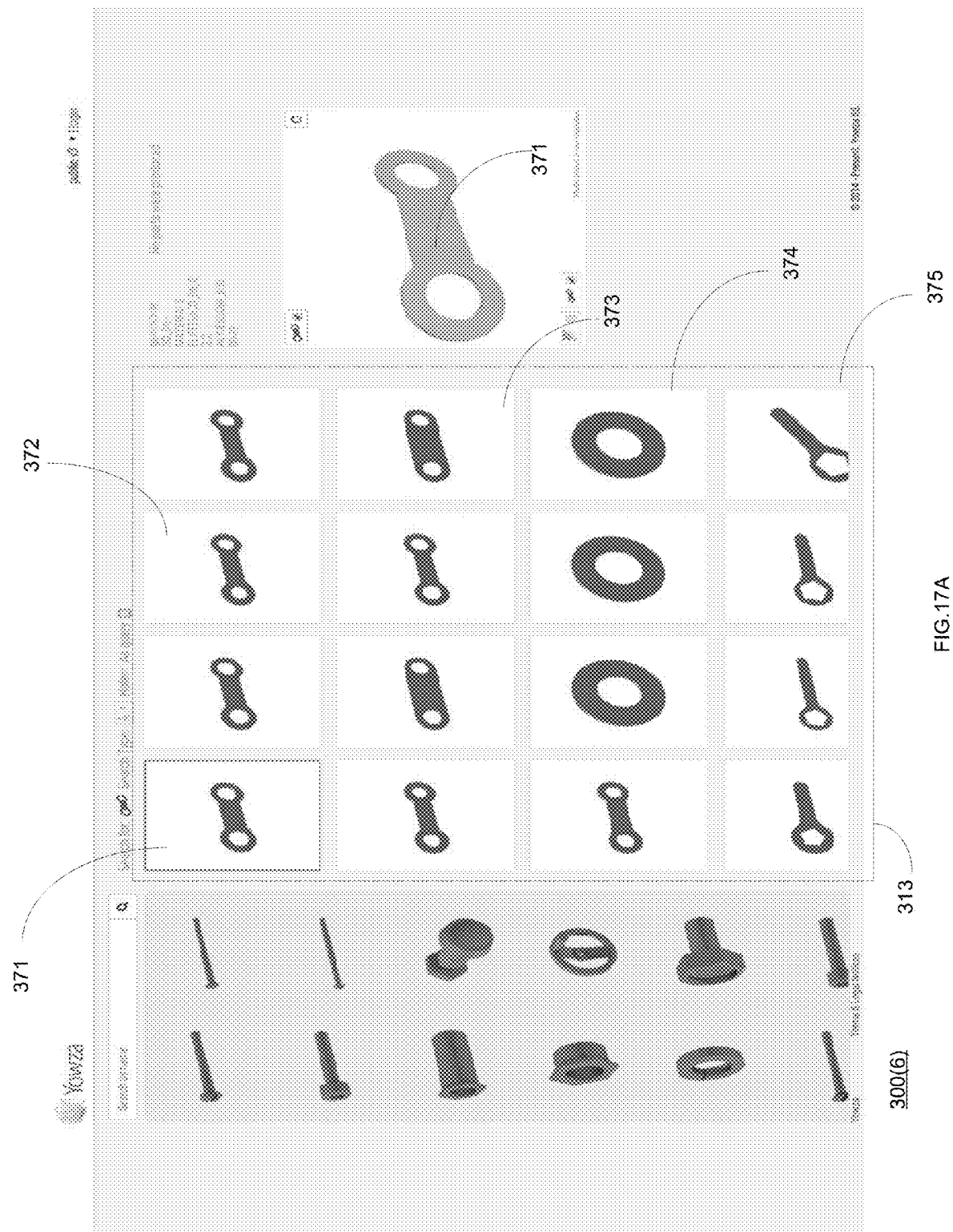
FIGS. 17A and 17B illustrate a snapshot of a screen that displays a search query that includes a search query of an representation of an object that includes two holes and a search result according to an embodiment of the invention.

FIG. 17A illustrates a snapshot of a screen 300(6) that displays a search result that was generated in response to a search query that included a selection of selected representation 371 of an object that includes two holes.

The search result (displayed in main area 313) includes representations of objects that include two holes (for example, representations 372 and 373) and includes representations of objects that include a single hole (for example representations 374 and 375) and a response to the search query according to an embodiment of the invention.

Figure 17B:
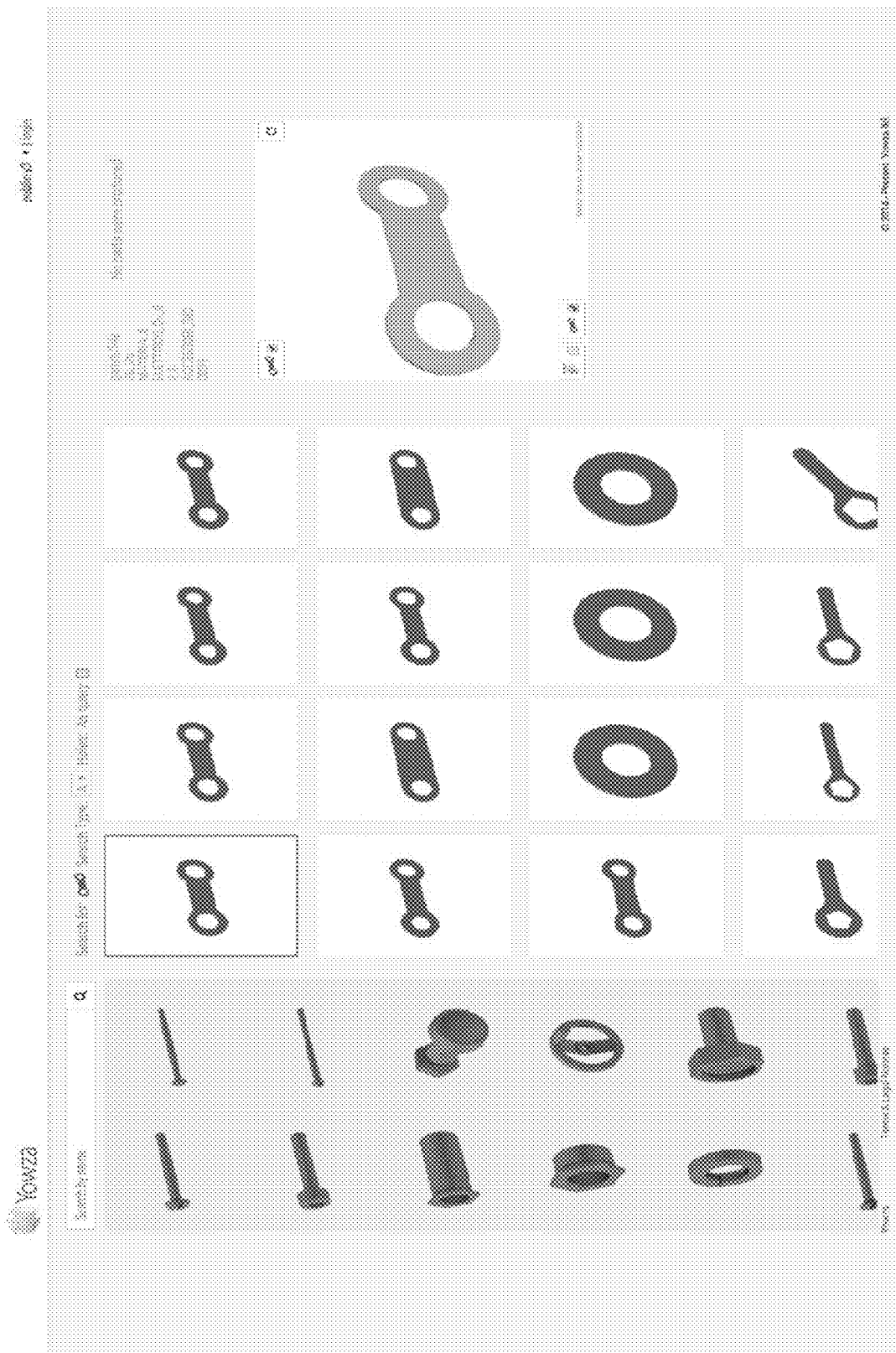

FIG. 17B illustrates the snapshot of screen 300(6) without reference numbers, boxes and arrows.

Figure 18A:
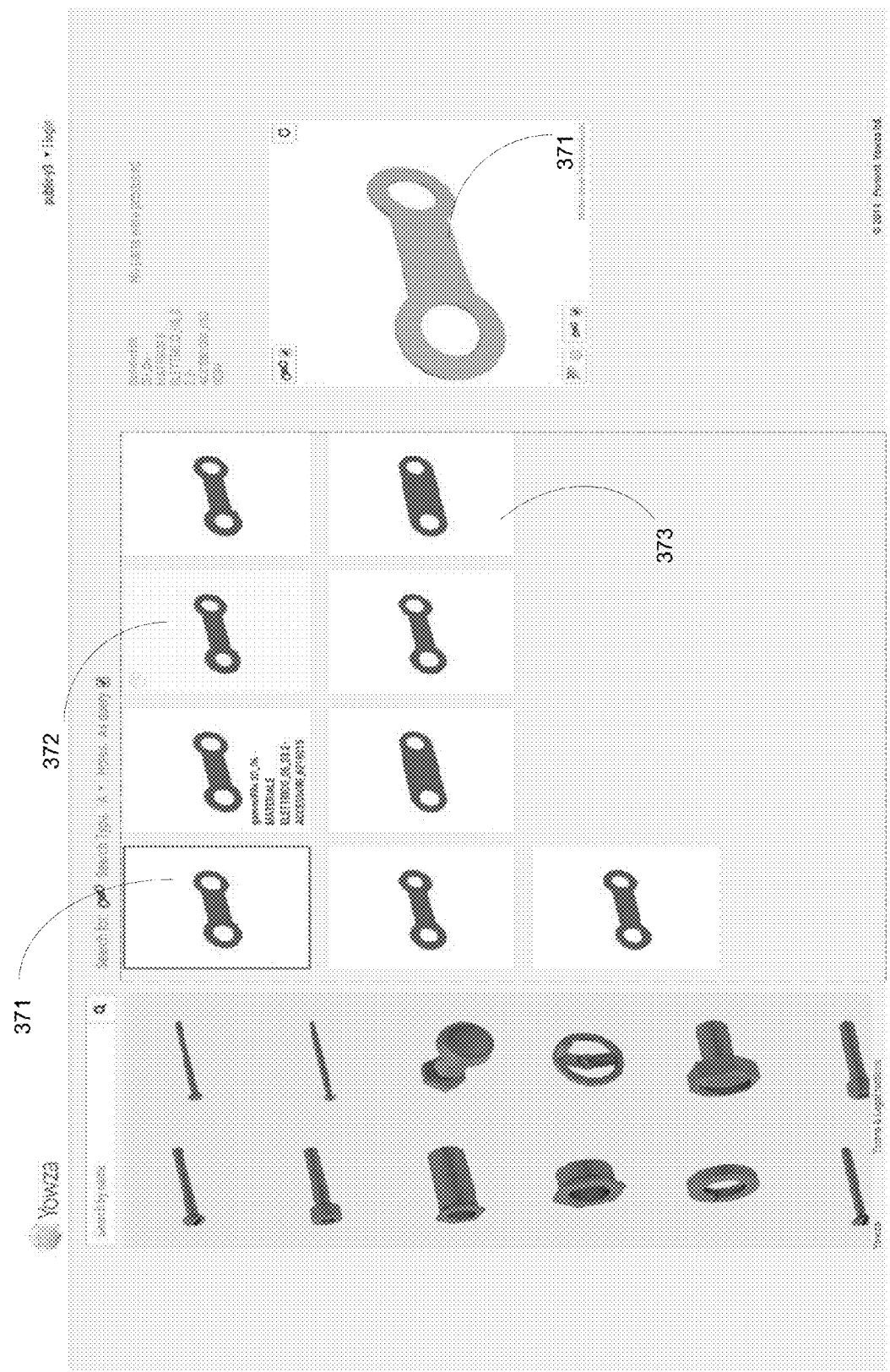
FIGS. 18A and 18B illustrate a snapshot of a screen that displays a genus based search result generated in response to a search query that included a representation of an object that includes two holes according to an embodiment of the invention.

FIG. 18A illustrates a snapshot of a screen 300(7) that displays a genus based search result that was generated in response to search query that includes a representation of an object that includes two holes.

Screen 300(7) illustrates the outcome of a genus based search algorithm that searched, within the search results of FIG. 8, only representations of the same genus of selected representations 371—representations of objects that include only two holes.

Accordingly—while representations 372 and 373 appear in FIG. 18, the representations of the single hole objects (for example representations 374 and 375) are not included in the search result and are not displayed in screen 300(7).

Figure 18B:
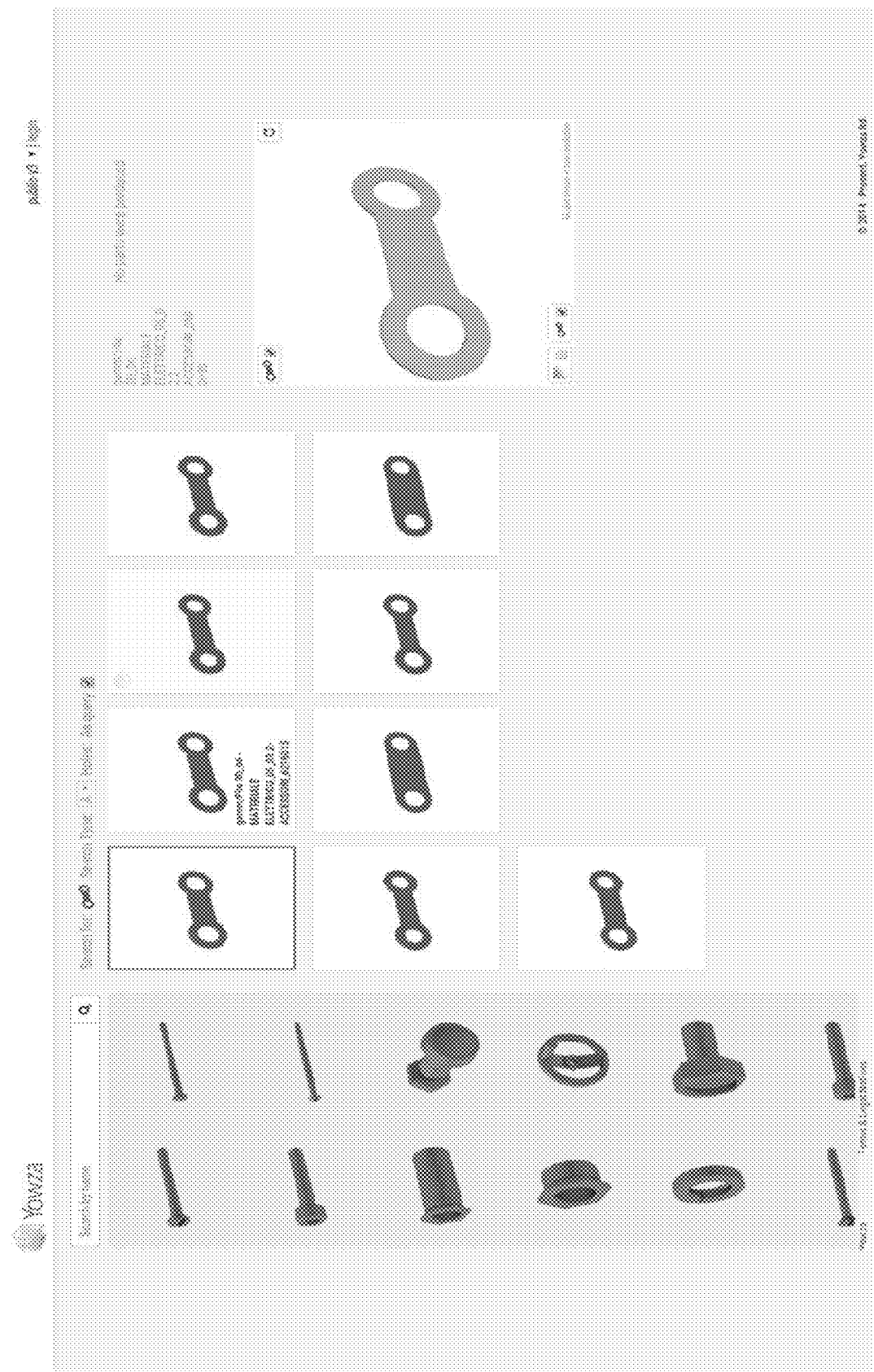

FIG. 18B illustrates the snapshot of screen 300(7) without reference numbers, boxes and arrows.

Figure 19A:
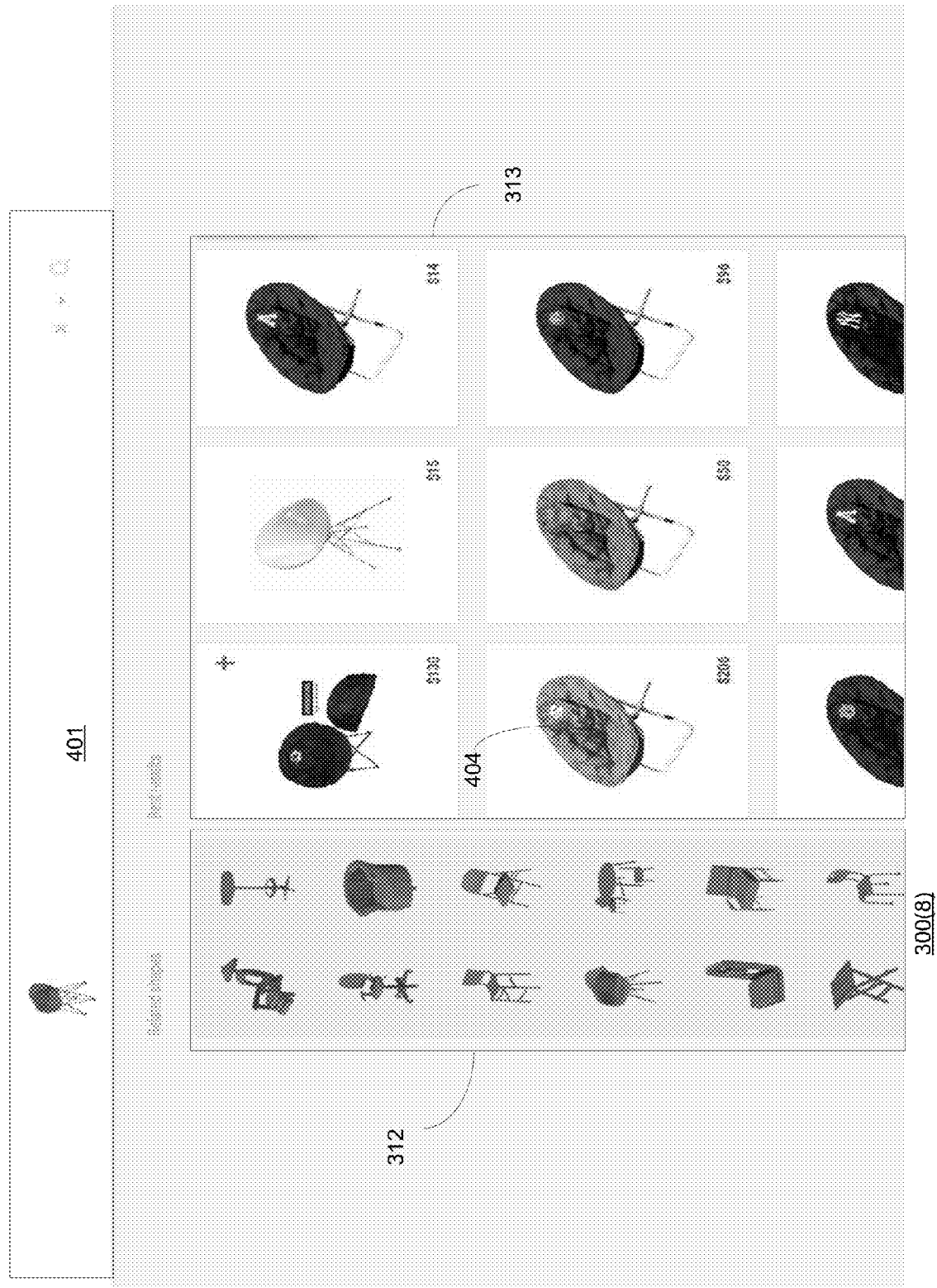
FIGS. 19A and 19B illustrate a snapshot of a screen that displays a search query and a search result according to an embodiment of the invention.
Figure 20:
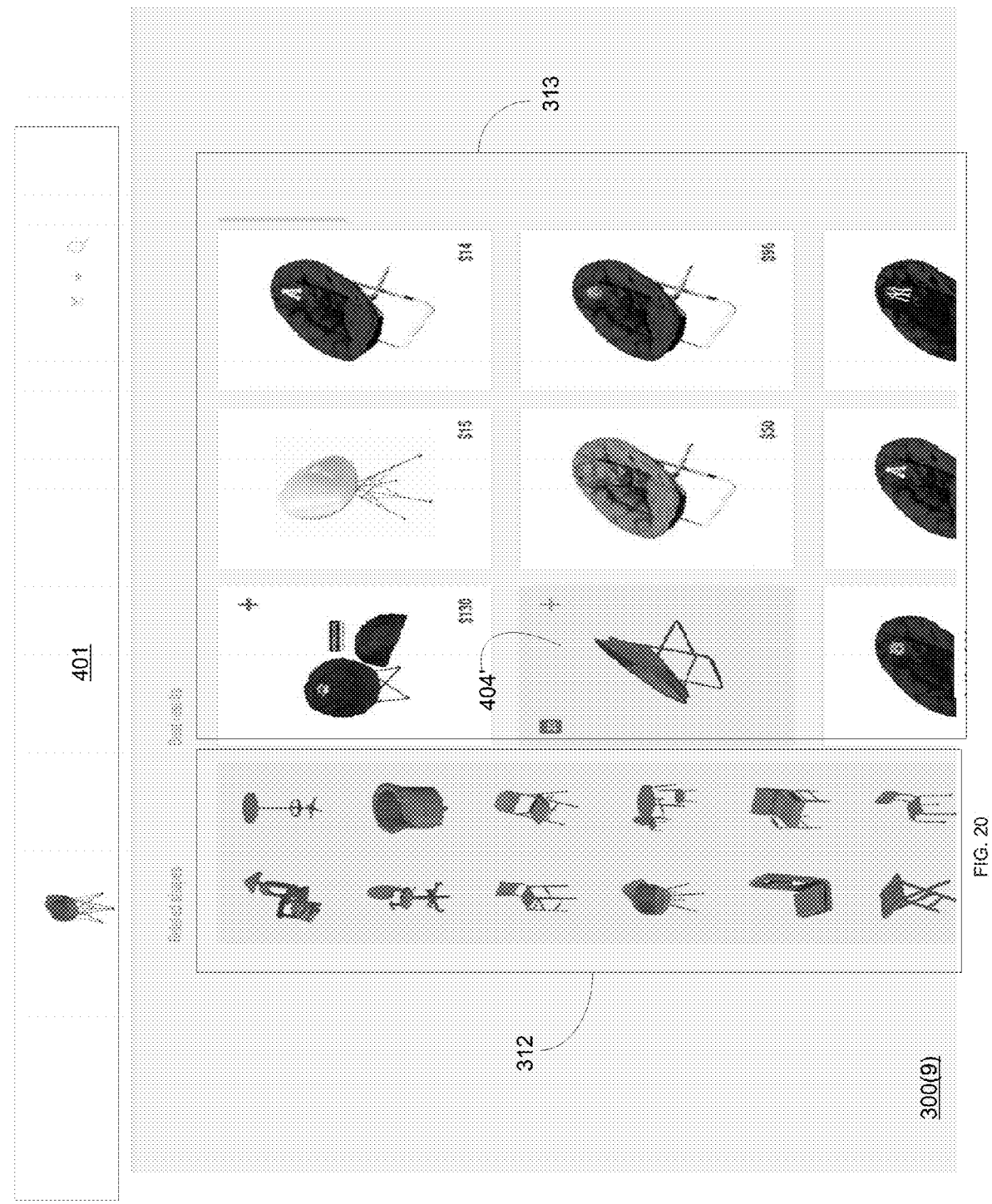
FIG. 20 illustrates a snapshot of a screen that displays a search query and a search result according to an embodiment of the invention.

FIGS. 19A and 20 illustrate snapshots of screens 300(8) and 300(9) that display search queries and responses to the search queries according to various embodiments of the invention.

In both figures there is a clear distinction between images of objects (that are displayed in main area 313) and between models of the objects (displayed in secondary area 312).

FIGS. 19A and 20 differ from each other by a rotation of representation 404.

Figure 19B:
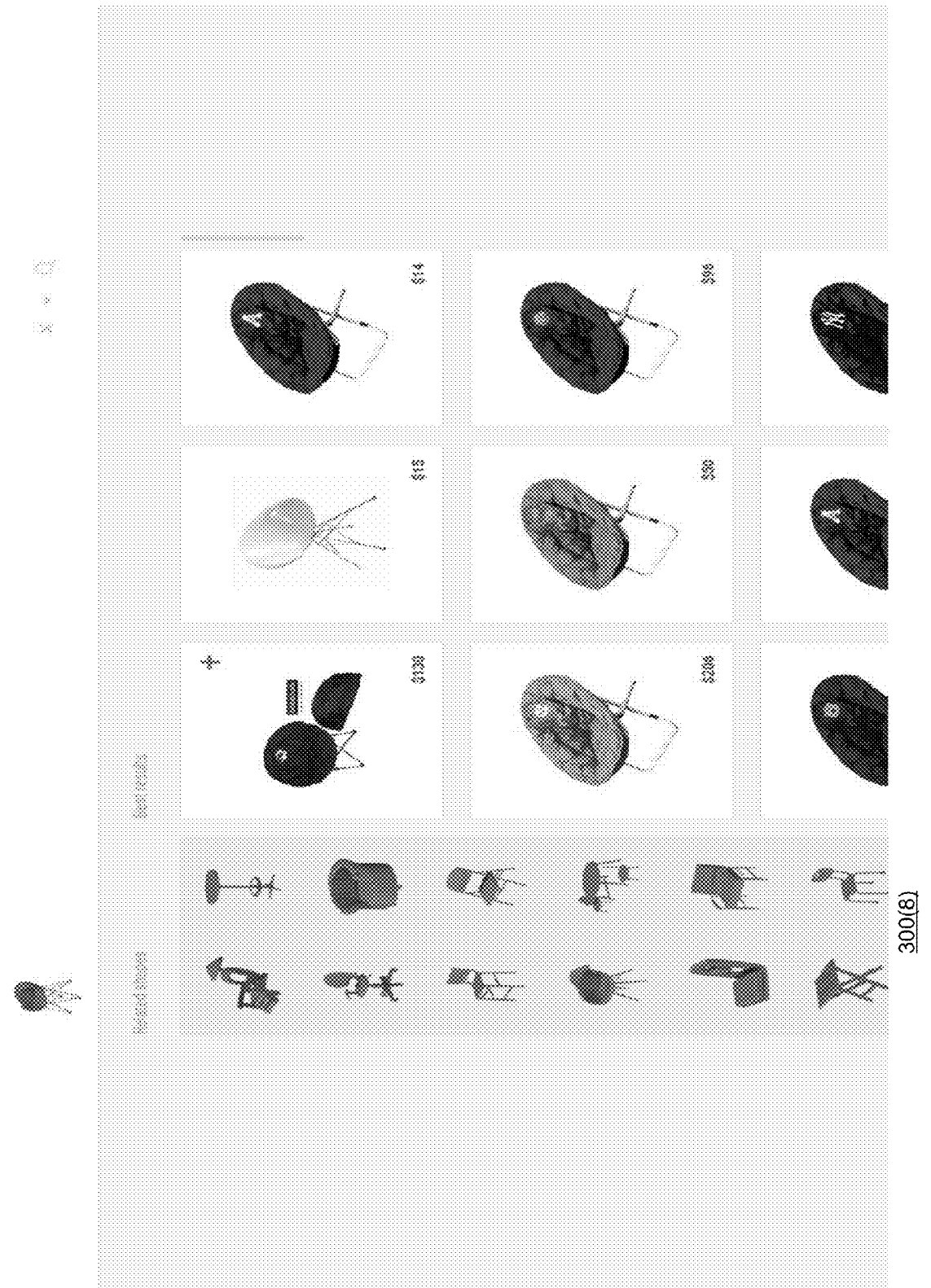

FIG. 19B illustrates the snapshot of screen 300(8) without reference numbers, boxes and arrows.

Figure 21:
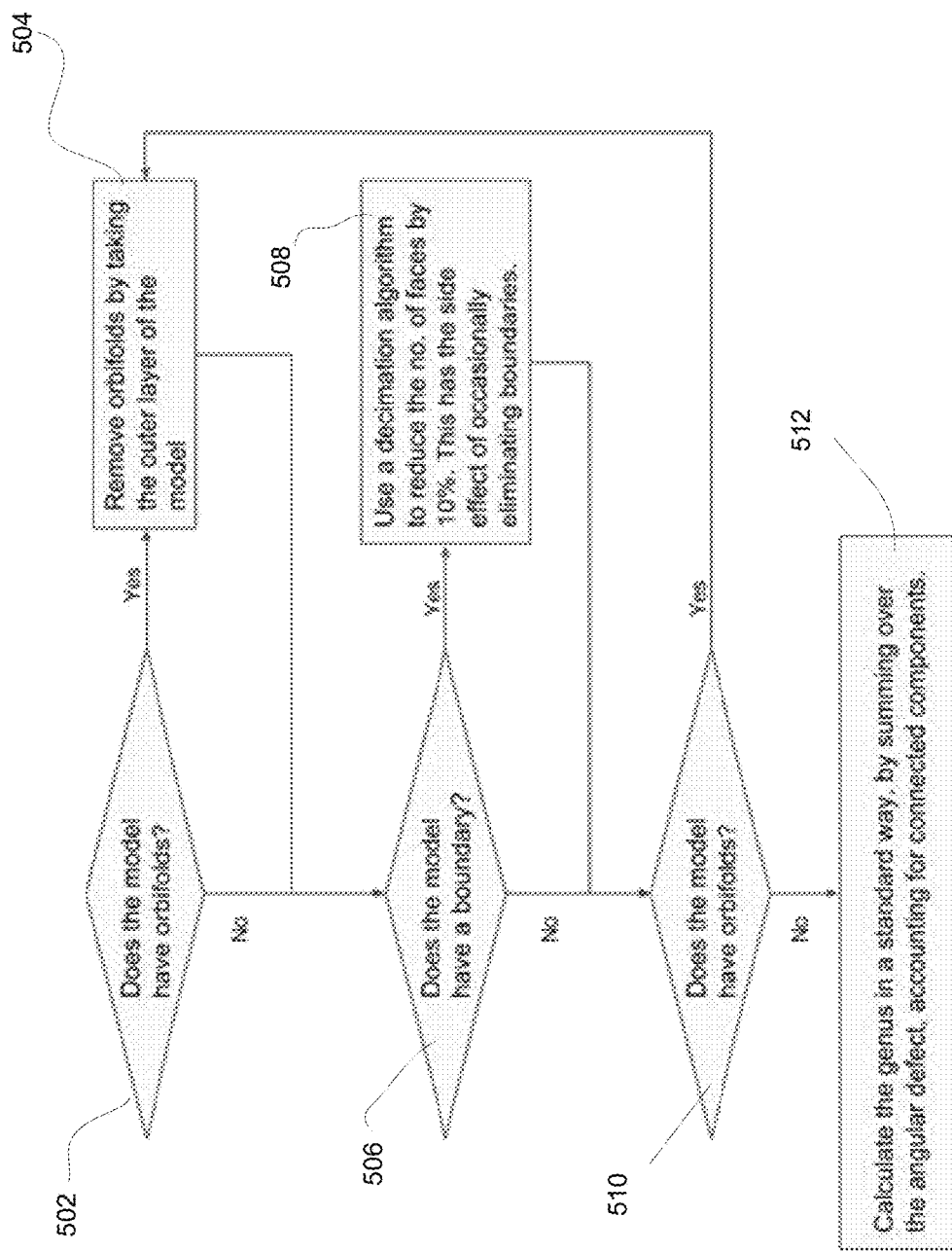
FIG. 21 illustrates a method according to an embodiment of the invention.

FIG. 21 illustrates a method 500 for genus calculation of a representation of an object according to an embodiment of the invention.

The genus of each representation is calculated and assigned to the representation.

It is assumed that the representation of the object is a three dimensional model of the object.

Genus based search is responsive to the genus of each object, as calculated by method 500.

Method 500 may start by step 502 of checking if the model has orbifolds. If yes—jumping to step 504 of removing the orbifolds by taking the outer layer of the model. If not—jumping to step 506. Step 504 is also followed by step 506.

Step 506 includes checking if the model has a boundary. If yes—jumping to step 508. If no—jumping to step 510.

Step 508 is followed by step 510.

Step 508 may include using a decimation algorithm to reduce the number of faces of the model by a predefined number (for example 10% or any other value). This has the side effect of occasionally eliminating boundaries.

Step 510 includes checking if the model has orbifolds. If yes—jumping to step 504. If not—jumping to step 512 of calculating the genus in any manner known in the art. For example—by summing over the angular defect, accounting for connected components.

FIG. 21 illustrates a method 600 according to an embodiment of the invention.

Method 600 may start by step 610 of calculating an initial set of representations of three dimensional objects.

Step 610 may be followed by step 620 of displaying the initial set of representations to a user. See, for example, FIGS. 12A and 12B.

A "displaying" of content may include displaying the content on a user device, causing the user device to display the content, sending the content towards the user device, and the like.

Step 620 may be followed by step 630 of receiving a current search query from the user. The search query may be a text query, may include a selection of one of the representations of the first set. If the representations of the first set are virtually segmented to parts then the search query may identify one or more parts to be used as the current search query.

Step 630 may be followed by step 640 of calculating a current search result.

Step 640 may be followed by step 650 of displaying the current search result.

Step 650 may be followed by step 660 of changing the display of at least one representation included in the current search result.

Step 660 may include, for example, rotating a representation, changing a transparency of a representation, changing the complexity or compression level of a representation.

Additionally or alternatively, step 660 may include selecting multiple representations that will be used to generate a merged object.

Step 660 may be followed by a next iteration of steps 620, 630, 640, 650 and 660 during which a new (next) search query will be received and a new (next) search result (of a next set of representations) may be generated.

Accordingly, steps 620, 630, 640, 650 and 660 may be repeated multiple times.

Alternatively, step 650 may be followed by step 620 and multiple repetitions of steps 620, 630, 640 and 650 may be provided.

It is noted that the search results may be accompanied by (or include) additional content such as an illustration of the different parts of one or more representations, providing different types of representations of the same objects, and the like.

FIGS. 13A, 13B, 14, 15A, 15B, 16A, 16B, 17A, 17B, 18A, 18B, 19A, 19B, 20, 24A, 24B, 25A and 25B provide non-limiting examples of snapshots of screens that may be displayed during different steps of method 600.

Figure 22:
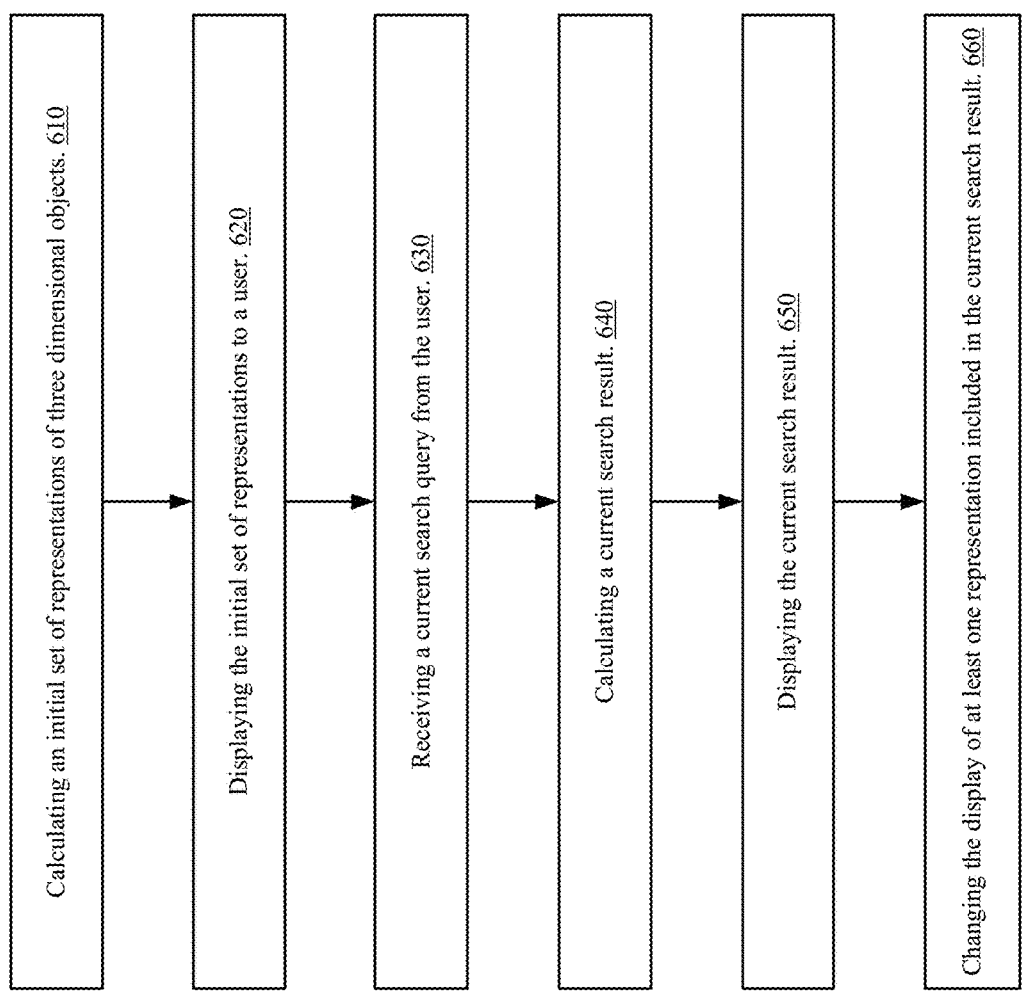
FIG. 22 illustrates a method according to an embodiment of the invention.
Figure 23:
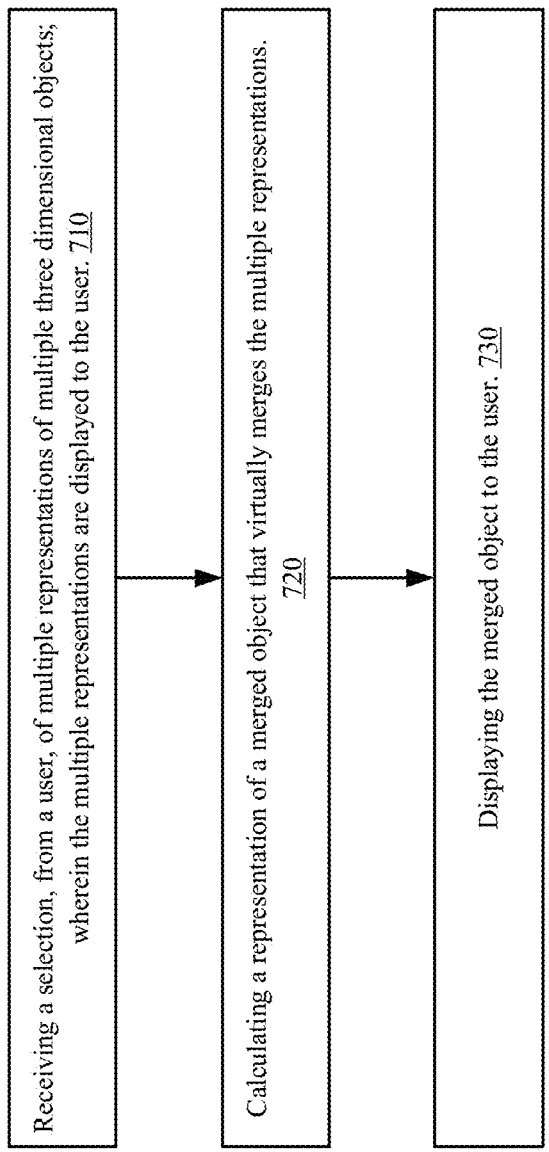
FIG. 23 illustrates a method according to an embodiment of the invention.

FIG. 22 illustrates a method 700 according to an embodiment of the invention.

Method 700 may start by step 710 of receiving a selection, from a user, of multiple representations of multiple three dimensional objects; wherein the multiple representations are displayed to the user.

Step 710 may be followed by step 720 of calculating a representation of a merged object that virtually merges the multiple representations.

Step 720 may be followed by step 730 of displaying the merged object to the user.

The merged object may include overlapping and non-overlapping parts.

Figure 24A:
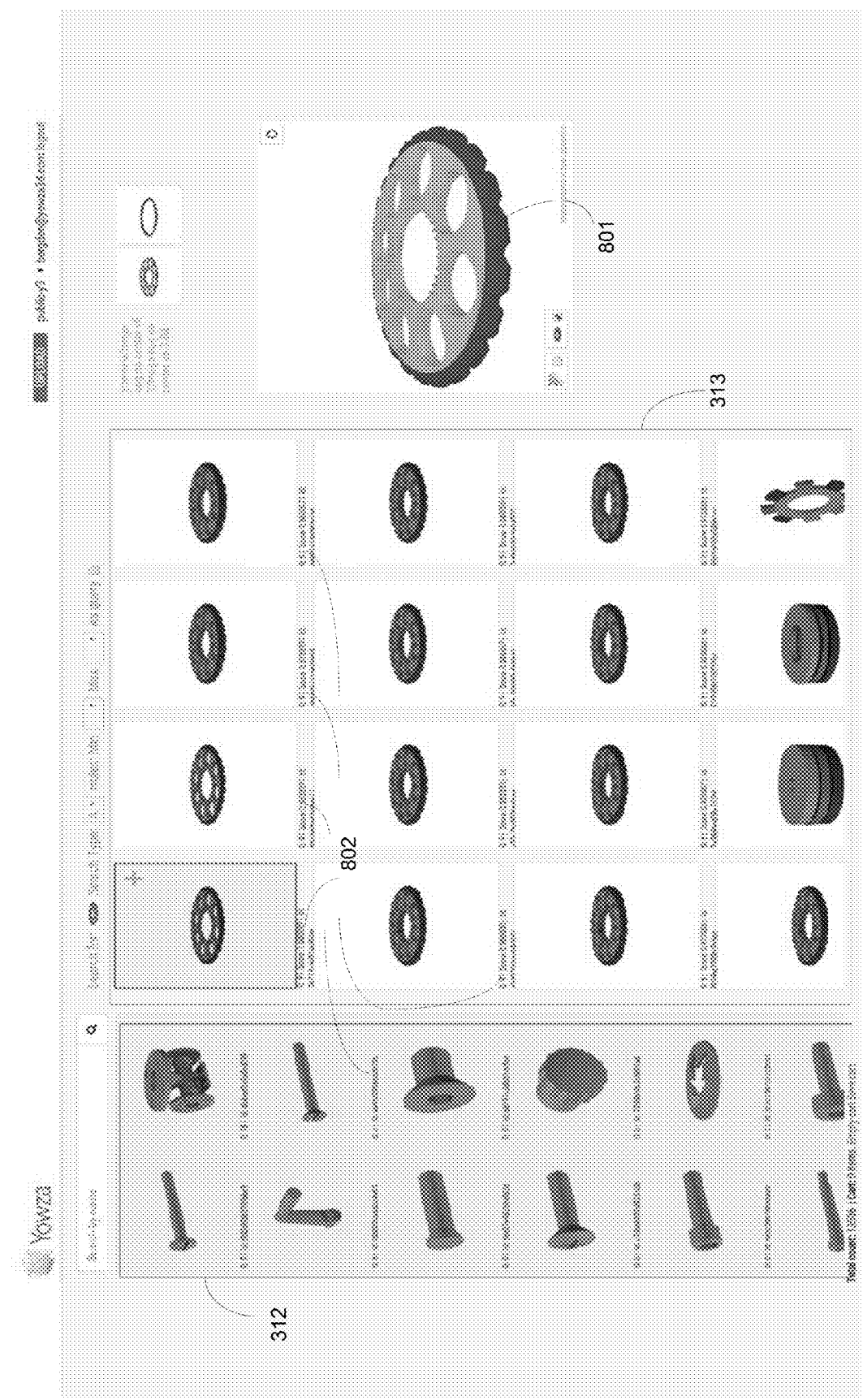
FIGS. 24A and 24B illustrate a snapshot of a screen that displays a search query and a search result according to an embodiment of the invention.

FIG. 24A illustrates a snapshot of a screen 300(10) that displays a search result resulting from a search query that identifies a representation of an object 801 that includes eight holes according to an embodiment of the invention.

Figure 24B:
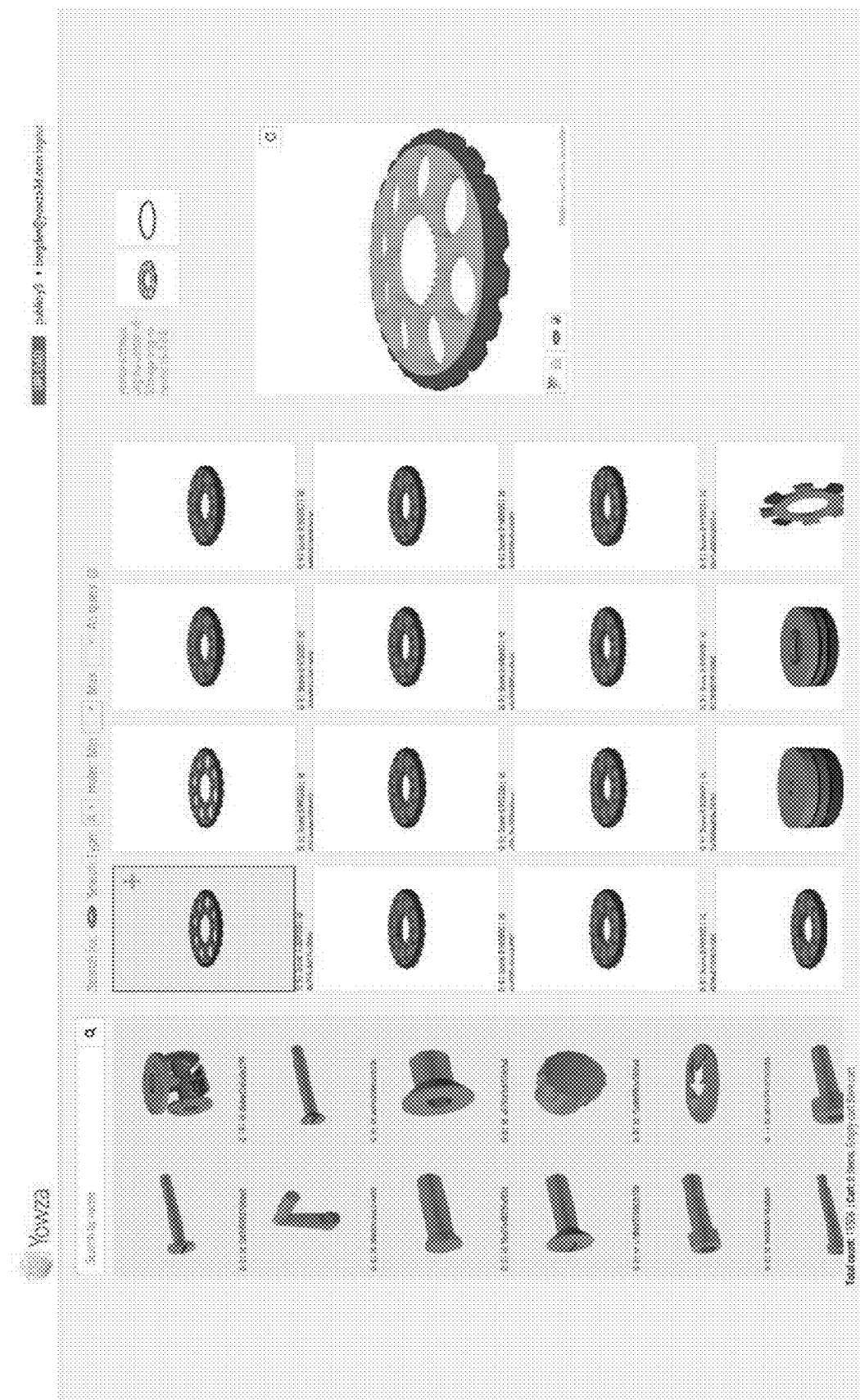

FIG. 24B illustrates the snapshot of screen 300(10) without reference numbers, boxes and arrows.

Figure 25A:
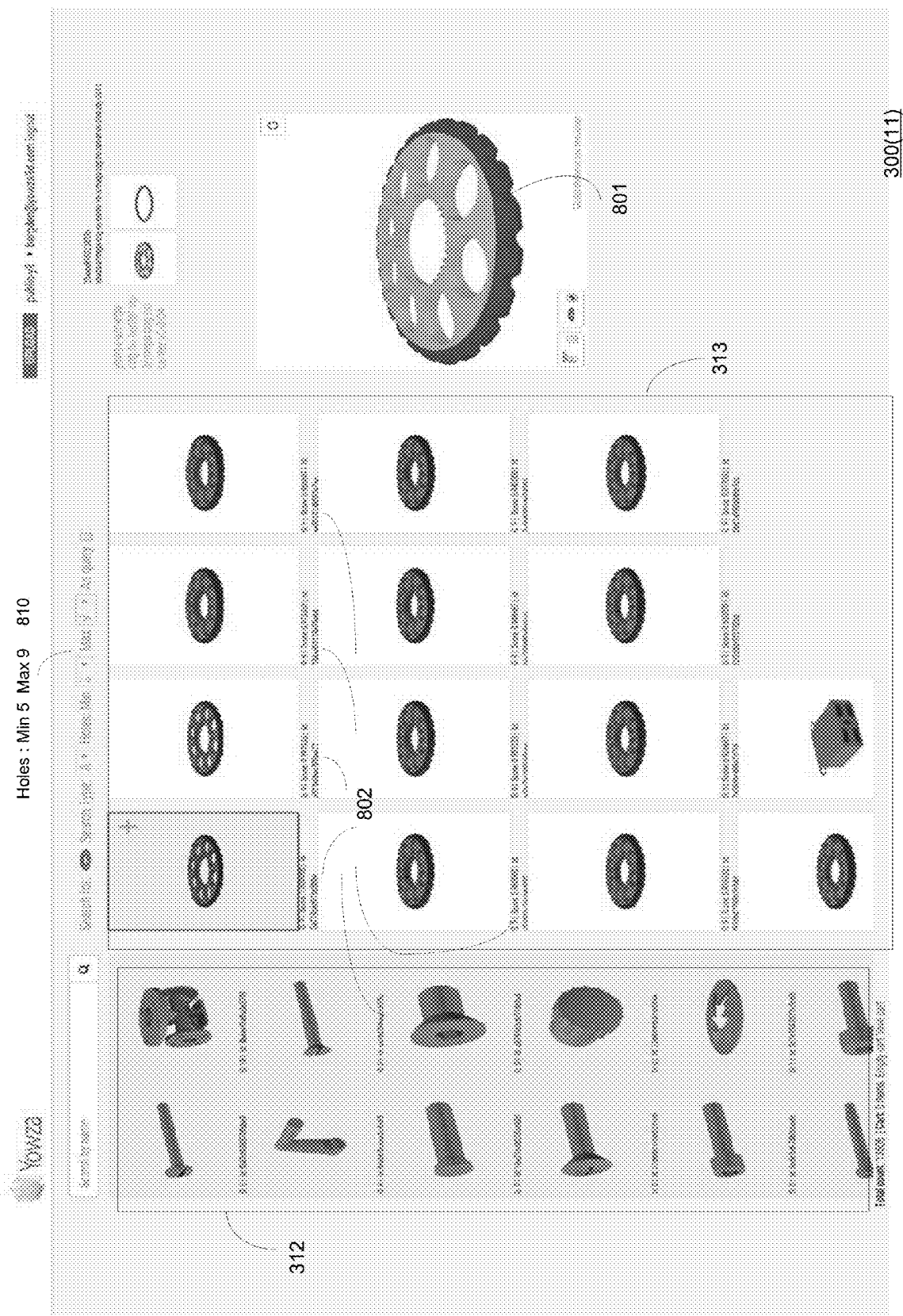
FIGS. 25A and 25B illustrate a snapshot of a screen that displays a genus based search result generated in response to a search query that included a representation of an object according to an embodiment of the invention.

FIG. 25A illustrates a snapshot of a screen 300(11) that displays a genus based search result resulting from a (a) search query that identifies a representation of an object 801 that includes eight holes and (b) from determining a genus range of objects that include between five to nine holes.

Figure 25B:
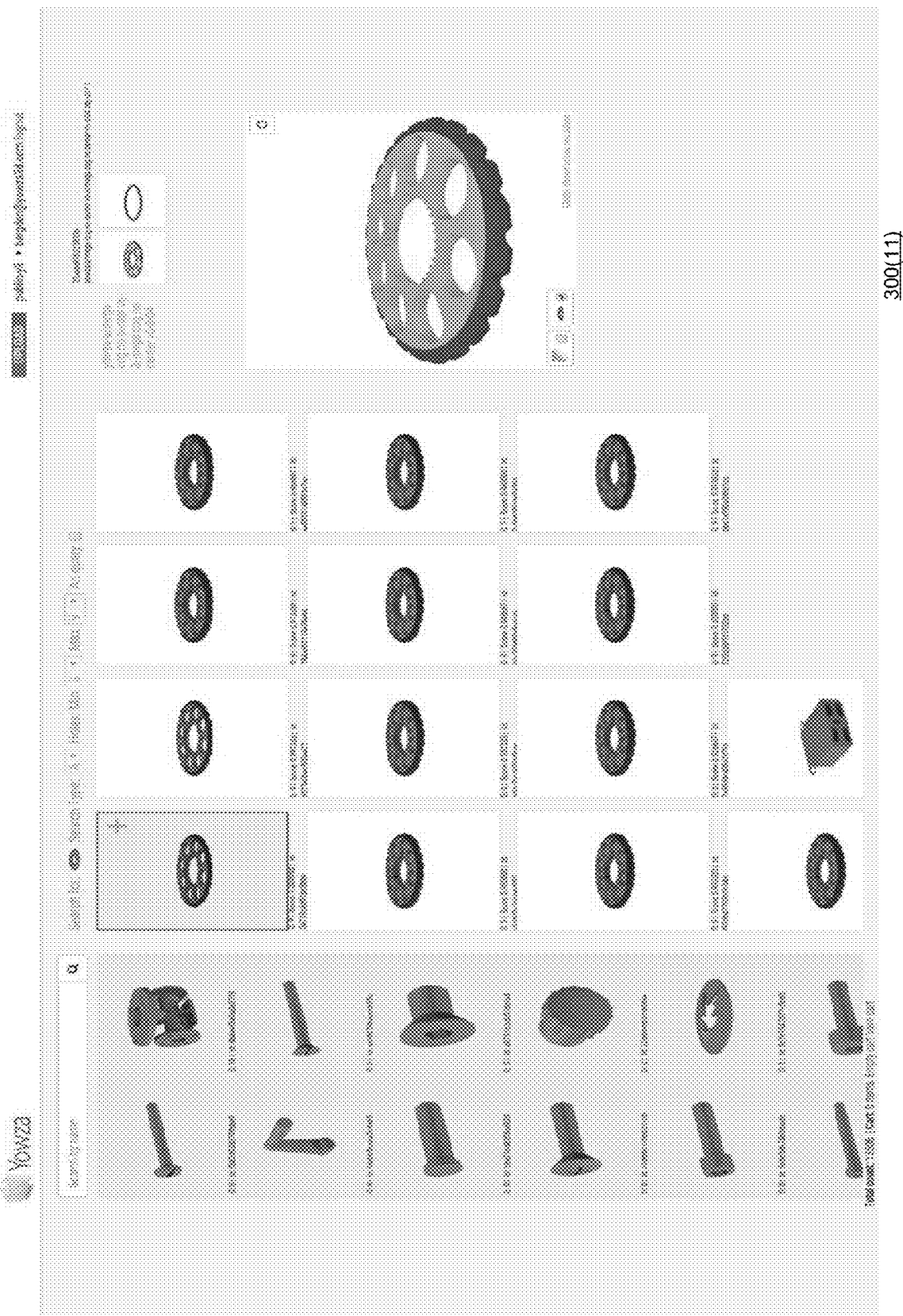

FIG. 25B illustrates the snapshot of screen 300(11) without reference numbers, boxes and arrows.

Any combination of the steps any method illustrated in the patent application may be provided.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM;

volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A non-transitory computer readable medium that stores instructions of an application that once executed by a computer cause the computer to execute the following stages of:
   receiving or generating a first search result that comprises a first set of representations of three dimensional objects, wherein
      multiple representations of the first set are virtually segmented to parts,
      the representations of the first set are compressed representations, and
      non-compressed representations of the first set are stored in a database of another computer;
   generating a first set of vectors each representing properties of a respective three dimensional object in the first search result;
   receiving a search query that identifies representations of a plurality of three dimensional objects that do not belong to each other and form a subset of the first set;
   generating, in response to the forming of the subset of the first set, a second search result, wherein
      the second search result comprises a second set of representations of three dimensional objects, and
      the representations of the second set are compressed representations;
   generating a subset vector that represents the second search result and wherein the second search result is responsive to a relationship between the subset vector and vectors that represents the three dimensional objects of the first set,
   receiving a request, from a client, to provide a detailed version of a certain representation of the second set; and
   applying client side rendering, by the computer, to provide the non-compressed version of the certain representation of the second set to the client.

2. The non-transitory computer readable medium according to claim 1 that stores instructions for displaying the first search result, and wherein the displaying comprises differentiating between different parts of the multiple representations.

3. The non-transitory computer readable medium according to claim 1, wherein the generating of the second search result is preceded by allowing a selection, out of a set of search algorithms, of a search algorithm to be applied for generating the second search result.

4. The non-transitory computer readable medium according to claim 3, wherein the set of search algorithms comprises a genus based search algorithm.

5. The non-transitory computer readable medium according to claim 1 that stores instructions for preserving a state of the application in a Uniform Resource Locator (URL).

6. The non-transitory computer readable medium according to claim 5 that stores instructions for receiving a search query that identified a given representation of the second set; and generating, in response to the given representation, a third search result.

7. The non-transitory computer readable medium according to claim 1 that stores instructions for receiving a request to print a three dimensional object represented by one of the representations of the second set; and printing the three dimensional object.

8. The non-transitory computer readable medium according to claim 1 that stores instructions for displaying a less-compressed representation of at least one representation of the first set.

9. The non-transitory computer readable medium according to claim 1 that stores instructions for displaying an initial set of representations before the receiving or generating the first search result.

10. The non-transitory computer readable medium according to claim 9 that stores instructions for generating the initial set of representations based upon objects that belong to a cluster.

11. The non-transitory computer readable medium according to claim 1 that stores instructions for displaying the first search result while differentiating between different types of the multiple representations.

12. The non-transitory computer readable medium according to claim 11, wherein the different types comprise object images and object models.

13. The non-transitory computer readable medium according to claim 1 that stores instructions for displaying a set of images that display different views of at least one representation of the first set.

14. The non-transitory computer readable medium according to claim 1 that stores instructions for determining a range of differences between members of the second set of three dimensional objects based on a similarity between a plurality of query models.

15. The non-transitory computer readable medium according to claim 14 that stores instructions for assigning a higher weight to a property of a query model of the plurality of query models, the property is rarer than another property of the query model.

16. The non-transitory computer readable medium according to claim 1, wherein the first set of representations and the second set of representations of three dimensional objects are of a same type.

17. A computer, comprising a processor and a memory module, wherein the processor is arranged to:
receive or generate a first search result that comprises a first set of representations of three dimensional objects, wherein
the representations of the first set are compressed representations,
non-compressed representations of the first set are stored in a database of another computer, and
multiple representations of the first set are virtually segmented to parts;
generate a first set of vectors each representing properties of a respective three dimensional object in the first search result;
receive a search query that identifies representations of a plurality of three dimensional objects that do not belong to each other and form a subset of the first set;
generate, in response to the forming of the first subset, a second search result, wherein
the memory module is configured to store the first set of representations of three dimensional objects,
the second search result comprises a second set of representations of three dimensional objects, and
the representations of the second set are compressed representations;
generate a subset vector that represents the second search result and wherein the second search result is responsive to a relationship between the subset vector and the first set of vectors;
receive a request, from a client, to provide a detailed version of a certain representation of the second set; and
apply client side rendering, by the computer, to provide the non-compressed version of the certain representation of the second set to the client.

18. A method, comprising:
receiving or generating, by a computer, a first search result that comprises a first set of representations of three dimensional objects, wherein
the representations of the first set are compressed representations,
non-compressed representations of the first set are stored in a database of another computer, and
multiple representations of the first set are virtually segmented to parts;
generating a first set of vectors each representing properties of a respective three dimensional object in the first search result;
receiving a search query that identifies representations of a plurality of three dimensional objects that do not belong to each other and form a subset of the first set;
generating, in response to the forming of the first subset, a second search result, wherein
the second search result comprises a second set of representations of three dimensional objects, and
the representations of the second set are compressed representations;
generating a subset vector that represents the second search result and wherein the second search result is responsive to a relationship between the subset vector and the first set of vectors;
receiving a request, from a client, to provide a detailed version of a certain representation of the second set; and
applying client side rendering, by the computer, to provide the non-compressed version of the certain representation of the second set to the client.

19. The method according to claim 18, further comprising generating and displaying a merged object with overlapping and non-overlapping parts.

* * * * *